(12) United States Patent
Yuuki

(10) Patent No.: US 11,276,836 B2
(45) Date of Patent: Mar. 15, 2022

(54) ORGANIC ELECTROLUMINESCENCE DEVICE AND POLYCYCLIC COMPOUND FOR ORGANIC ELECTROLUMINESCENCE DEVICE

(71) Applicant: SAMSUNG DISPLAY CO., LTD., Yongin-si (KR)

(72) Inventor: Miyazaki Yuuki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 404 days.

(21) Appl. No.: 16/514,784

(22) Filed: Jul. 17, 2019

(65) Prior Publication Data

US 2020/0185635 A1 Jun. 11, 2020

(30) Foreign Application Priority Data

Dec. 10, 2018 (KR) .......................... 10-2018-0158374

(51) Int. Cl.
*C07F 5/02* (2006.01)
*H01L 51/00* (2006.01)
*H01L 51/50* (2006.01)

(52) U.S. Cl.
CPC ...... *H01L 51/5072* (2013.01); *H01L 51/0061* (2013.01); *H01L 51/0067* (2013.01); *H01L 51/0072* (2013.01); *H01L 51/0073* (2013.01); *H01L 51/0074* (2013.01); *H01L 51/5056* (2013.01)

(58) Field of Classification Search
CPC ..... C07F 5/02; H01L 51/0061; H01L 51/0071
See application file for complete search history.

(56) References Cited

U.S. PATENT DOCUMENTS

| | | | |
|---|---|---|---|
| 9,065,060 B2 | 6/2015 | Hong et al. | |
| 2015/0236274 A1 | 8/2015 | Hatakeyama et al. | |
| 2017/0018710 A1 | 1/2017 | Mujica-Fernaud et al. | |
| 2018/0094000 A1 | 4/2018 | Hatakeyama et al. | |
| 2018/0114907 A1 | 4/2018 | Takada et al. | |
| 2018/0148462 A1 | 5/2018 | Fuchiwaki | |
| 2018/0331290 A1 | 11/2018 | Miyake et al. | |

FOREIGN PATENT DOCUMENTS

| | | |
|---|---|---|
| CN | 107501311 A | 12/2017 |
| JP | 2000012229 A | 1/2000 |
| JP | 5935199 B2 | 6/2016 |
| KR | 10-2011-0047803 A | 2/2013 |
| KR | 10-2014-0015202 A | 2/2014 |
| KR | 10-2016-0119683 A | 10/2016 |
| KR | 10-2017-0096039 A | 8/2017 |
| KR | 10-2017-0130435 A | 11/2017 |
| KR | 10-1854886 B2 | 5/2018 |
| KR | 10-2018-0044799 A | 6/2018 |
| KR | 10-2018-0062561 A | 6/2018 |

(Continued)

*Primary Examiner* — Vu A Nguyen
(74) *Attorney, Agent, or Firm* — Lewis Roca Rothgerber Christie LLP

(57) ABSTRACT

An organic electroluminescence device includes a first electrode, a hole transport region on the first electrode, an emission layer on the hole transport region, an electron transport region on the emission layer, and a second electrode on the electron transport region, wherein the emission layer includes a polycyclic compound represented by Formula 1.

20 Claims, 2 Drawing Sheets

(56) References Cited

FOREIGN PATENT DOCUMENTS

| KR | 10-2020-0071192 A | 6/2020 | |
|----|----|----|----|
| WO | WO 2010/050778 A1 | 5/2010 | |
| WO | WO 2012/099376 A2 | 7/2012 | |
| WO | WO 2015/102118 A1 | 7/2015 | |
| WO | WO 2015/131976 A1 | 9/2015 | |
| WO | WO 2016/152418 A1 | 9/2016 | |
| WO | WO-2016152418 A1 * | 9/2016 | ............. C09K 11/06 |
| WO | WO-2016152544 A1 * | 9/2016 | ............. C09K 11/06 |
| WO | WO-2017188111 A1 * | 11/2017 | ......... H01L 51/5072 |
| WO | WO 2018/047639 A1 | 3/2018 | |

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2018-0158374, filed on Dec. 10, 2018, the entire contents of which are incorporated herein by reference.

BACKGROUND

The development of an organic electroluminescence display device as an image display device is being actively conducted. Different from a liquid crystal display device, the organic electroluminescence display device is a so-called self-luminescent display device in which holes and electrons injected from a first electrode and a second electrode recombine in an emission layer, and a light emission material including an organic compound in the emission layer configured to emit light to display an image.

In the application of an organic electroluminescence device to a display device, the decrease of the driving voltage, and the increase of the emission efficiency and the life of the organic electroluminescence device are beneficial, and developments of materials for an organic electroluminescence device stably attaining the requirements are being substantially continuously conducted.

For example, recently, in order to provide an organic electroluminescence device having high efficiency, techniques for phosphorescence emission, which uses energy in a triplet state, or delayed fluorescence emission, which uses the generating phenomenon of singlet excitons by the collision of triplet excitons (triplet-triplet annihilation, "TTA") are being developed, and development of a material for thermally activated delayed fluorescence ("TADF") using a delayed fluorescence phenomenon is being conducted.

SUMMARY

The present disclosure herein relates to an organic electroluminescence device and a polycyclic compound used in the organic electroluminescence device.

For example, embodiments of the present disclosure provide an organic electroluminescence device having long lifespan and high efficiency, and a polycyclic compound used therein.

Embodiments of the present disclosure also provides an organic electroluminescence device including a material configured to emit thermally activated delayed fluorescence, and a polycyclic compound used as a material configured to emit thermally activated delayed fluorescence.

An embodiment of the present disclosure provides an organic electroluminescence device including a first electrode, a hole transport region on the first electrode, an emission layer on the hole transport region, an electron transport region on the emission layer, and a second electrode on the electron transport region, wherein the emission layer includes a polycyclic compound represented by the following Formula 1:

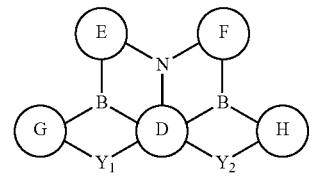

Formula 1

In Formula 1, ring D to ring H are each independently a substituted or unsubstituted aryl group having 6 to 30 carbon atoms for forming a ring, or a substituted or unsubstituted heteroaryl group having 2 to 30 carbon atoms for forming a ring, and $Y_1$ and $Y_2$ are each independently O or S.

In an embodiment, the emission layer may emit delayed fluorescence.

In an embodiment, the emission layer may be a delayed fluorescence emission layer including a host and a dopant, and the dopant may include the polycyclic compound.

In an embodiment, the emission layer may be a thermally activated delayed fluorescence emission layer configured to emit blue light.

In Formula 1, ring D to ring F may be each independently a substituted or unsubstituted aryl group having 6 to 30 carbon atoms for forming a ring.

In an embodiment, Formula 1 may be represented by the following Formula 2:

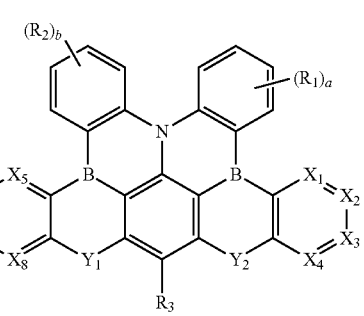

Formula 2

In Formula 2, $X_1$ to $X_8$ are each independently N or $CR_A$, $R_1$ to $R_3$ and $R_A$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or combined with an adjacent group to form a ring, "a" and "b" are each independently an integer of 0 to 4, and $Y_1$ and $Y_2$ are the same as defined in Formula 1.

In an embodiment, Formula 2 may be represented by the following Formula 3:

Formula 3

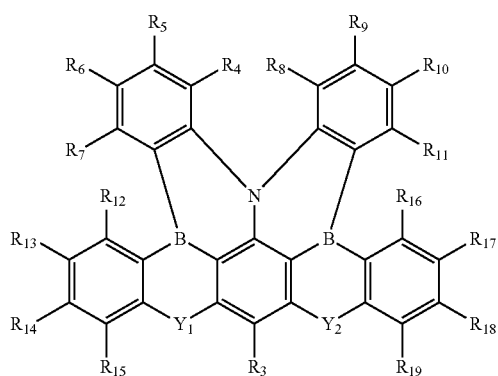

In Formula 3, $R_4$ to $R_{19}$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or combined with an adjacent group to form a ring, and $Y_1$, $Y_2$, and $R_3$ are the same as defined in Formula 2.

In an embodiment, groups in at least one pair among $R_4$ and $R_5$, $R_5$ and $R_6$, $R_6$ and $R_7$, $R_8$ and $R_9$, $R_9$ and $R_{10}$, $R_{10}$ and $R_{11}$, $R_{12}$ and $R_{13}$, $R_{13}$ and $R_{14}$, $R_{14}$ and $R_{15}$, $R_{16}$ and $R_{17}$, $R_{17}$ and $R_{18}$, and $R_{18}$ and $R_{19}$ in Formula 3 may be combined with each other to form a ring represented by any one among the following Formula 4-1 to Formula 4-4:

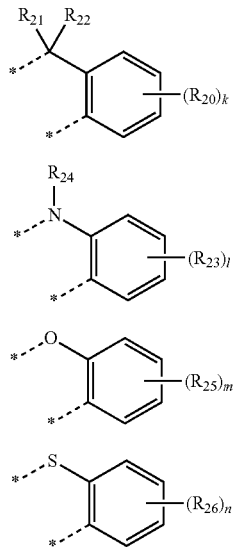

Formula 4-1

Formula 4-2

Formula 4-3

Formula 4-4

In Formula 4-1 to Formula 4-4, $R_{20}$ to $R_{26}$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, and "k" to "n" are each independently an integer of 0 to 4.

In an embodiment, at least one pair among $R_4$ and $R_a$, $R_7$ and $R_{12}$, and $R_n$ and $R_{16}$ in Formula 3 may be combined with —O— or —S— to form a ring.

In an embodiment, Formula 3 may be represented by any one among the following Formula 5-1 to Formula 5-3:

Formula 5-1

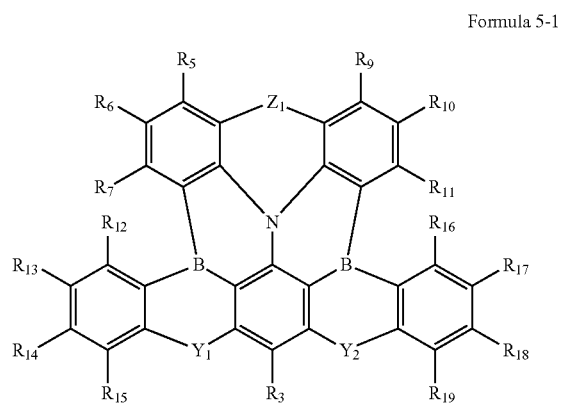

Formula 5-2

Formula 5-3

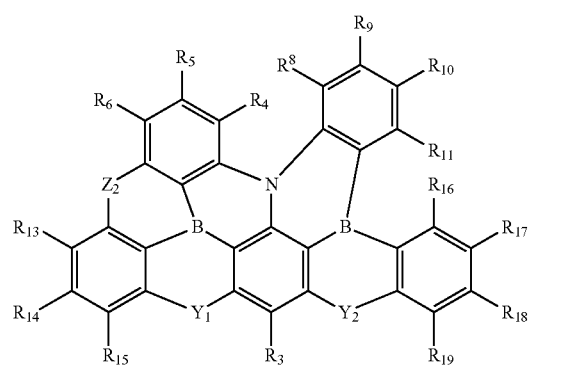

In Formula 5-1 to Formula 5-3, $Z_1$ to $Z_3$ are each independently O or S, and $R_3$ to $R_{19}$, $Y_1$ and $Y_2$ are the same as defined in Formula 3.

In Formula 1, $Y_1$ and $Y_2$ may be the same, for example, $Y_1$ and $Y_2$ may be each independently oxygen.

In an embodiment, the compound represented by Formula 1 may be any one among the compounds represented in Compound Group 1.

In an embodiment of the present disclosure, there is provided a polycyclic compound represented by Formula 1.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
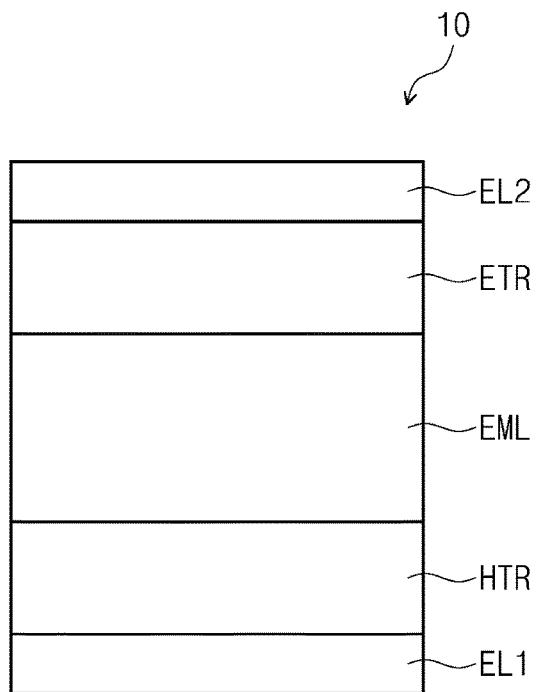
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, acts, operations, elements, parts, or the combination thereof, but do not preclude the presence or addition of one or more other features, numerals, acts, operations, elements, parts, or the combination thereof. It will also be understood that when a layer, a film, a region, a plate, etc. is referred to as being "on" another part, it can be "directly on" the other part, or intervening layers may also be present.

Hereinafter, the organic electroluminescence device according to an embodiment of the present disclosure will be explained with reference to FIGS. 1 to 3.

Figure 2:
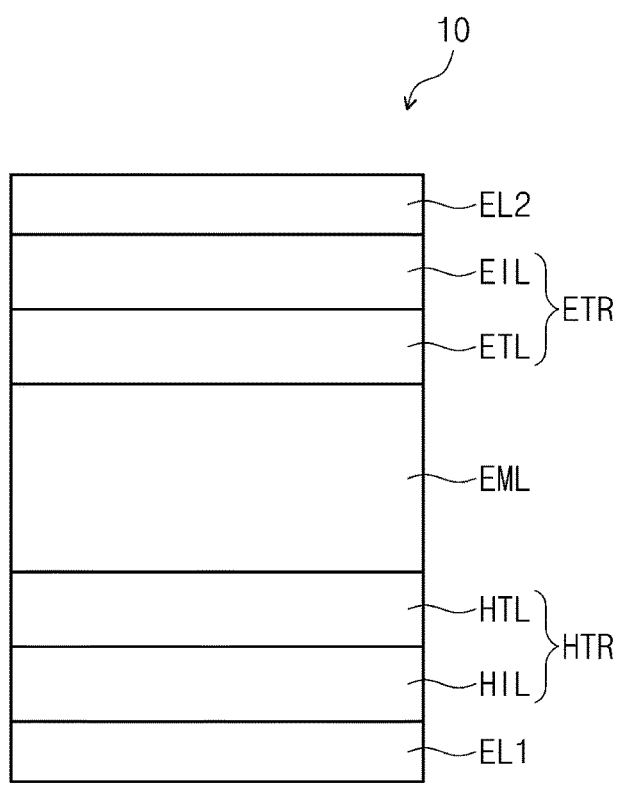
FIG. 2 is a cross-sectional view schematically illustrating an organic electroluminescence device according to an embodiment of the present disclosure.
Figure 3:
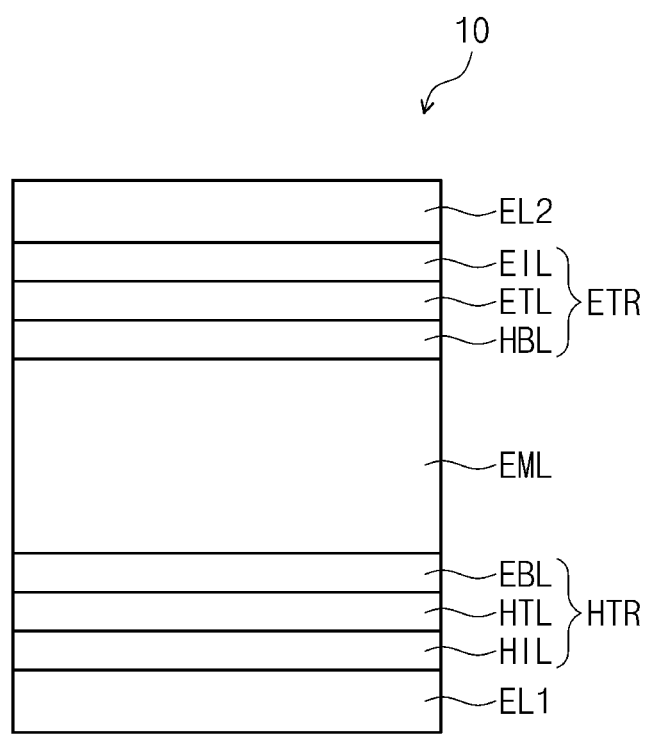
FIG. 3 is a cross-sectional view schematically illustrating an organic electroluminescence device according to an embodiment of the present disclosure.

Referring to FIGS. 1 to 3, an organic electroluminescence device 10 according to an embodiment may include a first electrode EL1, a hole transport region HTR, an emission layer EML, an electron transport region ETR and a second electrode EL2, stacked in the stated order (e.g., laminated one by one).

The first electrode EL1 and the second electrode EL2 are located opposite to each other, and a plurality of organic layers may be between the first electrode EL1 and the second electrode EL2. The plurality of the organic layers may include a hole transport region HTR, an emission layer EML, and an electron transport region ETR.

The organic electroluminescence device 10 of an embodiment may include the polycyclic compound of an embodiment in the emission layer EML.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

In the organic electroluminescence device 10 of embodiments of the disclosure, the first electrode EL1 has conductivity (e.g., is electrically conductive). The first electrode EL1 may be formed using a metal alloy or a conductive compound. The first electrode EL1 may be, for example, an anode.

The first electrode EL1 may be a transmissive electrode, a transflective electrode, or a reflective electrode. If the first electrode EL1 is the transmissive electrode, the first electrode EL1 may be formed using a transparent metal oxide such as, for example indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer and/or a transflective layer formed using the above materials, and a transmissive conductive layer formed using ITO, IZO, ZnO, and/or ITZO. For example, the first electrode EL1 may include a plurality of layers including ITO/Ag/ITO.

The hole transport region HTR is provided on the first electrode EL1. The hole transport region HTR may include at least one selected from a hole injection layer HIL, a hole transport layer HTL, a hole buffer layer, and an electron blocking layer EBL.

The hole transport region HTR may have a single layer formed using a single material, a single layer formed using a plurality of different materials, or a multilayer structure including a plurality of layers formed using the same or a plurality of different materials.

For example, the hole transport region HTR may have the structure of a single layer of a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various suitable methods such as, for example, a vacuum deposition method, a spin coating method, a cast method, a Langmuir-Blodgett (LB) method, an inkjet printing method, a laser printing method, and/or a laser induced thermal imaging (LITI) method.

The hole injection layer HIL of the organic electroluminescence device 10 of an embodiment may include any suitable hole injection material available in the art. For example, the hole injection layer HIL may include triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4''-tris(3-methyl phenyl phenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4''-tris{N,N-diphenylamino}triphenylamine (TDATA), 4,4',4''-tris(N,N-2-naphthyl phenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), dipyrazino[2,3-f:2',3'-h]quinoxaline-2,3,6,7,10,11-hexacarbonitrile (HAT-CN), and/or the like. However, embodiments of the present disclosure are not limited thereto.

The hole transport layer HTL of the organic electroluminescence device 10 of an embodiment may include any suitable hole transport material available in the art. For example, the hole transport layer HTL may include 1,1-bis[(di-4-tolylamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), N,N'-di(1-naphthyl)-N,N'-diphenylbenzidine (NPB), N,N'-bis(1-naphthyl)-N,N'-diphenyl-4,4'-diamine (α-NPD), and/or the like. However, embodiments of the present disclosure are not limited thereto.

Meanwhile, the hole transport region HTR may further include an electron blocking layer EBL, and the electron blocking layer EBL may be between a hole transport layer HTL and an emission layer EML. The electron blocking layer EBL may play the role of preventing or reducing electron injection from an electron transport region ETR to a hole transport region HTR.

The electron blocking layer EBL may include any suitable material available in the art. The electron blocking layer EBL may include, for example, carbazole derivatives such as N-phenylcarbazole, and/or polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl) triphenylamine (TCTA), N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-di(carbazol-9-yl)benzene (mCP), and/or the like. In addition, as described above, the electron blocking layer EBL may include the polycyclic compound according to an embodiment of the present disclosure.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may include, for example, a p-dopant. The p-dopant may be selected from quinone derivatives, metal oxides, and cyano group-containing compounds, without limitation. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, without limitation.

As described above, the hole transport region HTR may further include at least one selected from a hole buffer layer and an electron blocking layer EBL in addition to the hole injection layer HIL and the hole transport layer HTL. The hole buffer layer may compensate for a resonance distance according to the wavelength of the light emitted from the emission layer EML and increase light emission efficiency. Materials included in the hole transport region HTR may be used as materials included in the hole buffer layer.

The emission layer EML is provided on the hole transport region HTR. The emission layer EML may have a thickness of, for example, about 100 Å to about 600 Å. The emission layer EML may have a single layer formed using a single material, a single layer formed using a plurality of different materials, or a multilayer structure having a plurality of layers formed using the same or a plurality of different materials.

The emission layer EML may emit one selected from red light, green light, blue light, white light, yellow light, and cyan light. The emission layer EML may include a fluorescence emitting material or a phosphorescence emitting material.

In an embodiment, the emission layer EML may be a fluorescence emission layer. For example, a portion of the light emitted from the emission layer EML may be attributed to thermally activated delayed fluorescence (TADF). In some embodiments, the emission layer EML may include a light-emitting component configured to emit thermally activated delayed fluorescence. In an embodiment, the emission layer EML may be an emission layer configured to emit blue light by way of thermally activated delayed fluorescence.

In the description, --* means a connecting position (e.g., location of a chemical bond).

In the present description, the term "substituted or unsubstituted" means substituted or unsubstituted with at least one substituent selected from the group consisting of a deuterium atom, a halogen atom, a cyano group, a nitro group, a hydroxyl group, an amine group, a silyl group, a boron group, a phosphine oxide group, a phosphine sulfide group, an alkyl group, an alkenyl group, an alkoxy group, an aryl group, an aryloxy group, and a hetero aryl group. In addition, each of the foregoing substituents may be substituted or unsubstituted. For example, a biphenyl group may be interpreted as an aryl group or a phenyl group substituted with a phenyl group.

In the present description, the term "forming a ring via the combination with an adjacent group" may mean forming a substituted or unsubstituted hydrocarbon ring, or a substituted or unsubstituted heterocycle via a combination with an adjacent group. The term "hydrocarbon ring," as used herein, includes an aliphatic hydrocarbon ring and an aromatic hydrocarbon ring. The term "heterocycle," as used herein, includes an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, the two methyl groups may be interpreted as "adjacent groups" to each other, and in 1,1-diethylcyclopentane, the two ethyl groups may be interpreted as "adjacent groups" to each other.

In the present description, the term "halogen atom" may mean a fluorine atom, a chlorine atom, a bromine atom, or an iodine atom.

In the present description, the term "alkyl group" may refer to a linear, branched or cyclic type (or kind) of alkyl group. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the term "aryl group" means an optional functional group or substituent derived from an aromatic hydrocarbon ring. The aryl group may be a monocyclic aryl group or a polycyclic aryl group. The carbon number for forming a ring in the aryl group may be, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present description, the fluorenyl group may be substituted, and two substituents of the fluorenyl group may be combined with each other to form a spiro structure. Examples of a substituted fluorenyl group are as follows. However, embodiments of the present disclosure are not limited thereto.

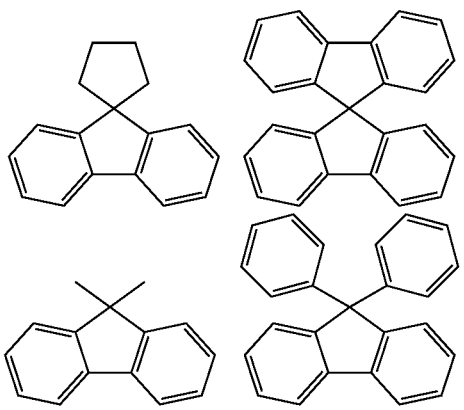

In the present description, the heteroaryl group may be a heteroaryl group including at least one selected from O, N, P, Si, and S as a heteroatom. The carbon number for forming a ring of the heteroaryl group may be 2 to 30, or 2 to 20. The heteroaryl group may be a monocyclic heteroaryl group or a polycyclic heteroaryl group. Examples of the heteroaryl group (e.g., a polycyclic heteroaryl group) may have a dicyclic or tricyclic structure. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuranyl, phenanthroline, thiazolyl, isooxazolyl, oxadiazolyl, thiadiazolyl, benzothiazolyl, phenothiazinyl, dibenzosilole, dibenzofuran, etc., without limitation.

In the present description, the silyl group includes an alkylsilyl group and/or an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the present description, the carbon number of the amine group is not specifically limited, but may be 1 to 30. The amine group may include an alkyl amine group and/or an aryl amine group. Examples of the amine group include a methylamine group, a dimethylamine group, a phenylamine group, a naphthylamine group, a 9-methyl-anthracenylamine group, a triphenylamine group, etc., without limitation.

In an embodiment, the emission layer EML includes a polycyclic compound represented by Formula 1.

Formula 1

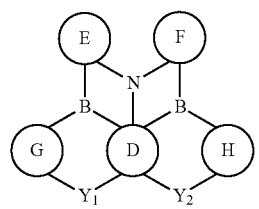

In Formula 1, ring D to ring H are each independently a substituted or unsubstituted aryl group having 6 to 30 carbon atoms for forming a ring, or a substituted or unsubstituted heteroaryl group having 2 to 30 carbon atoms for forming a ring.

In Formula 1, $Y_1$ and $Y_2$ are each independently O or S.

The polycyclic compound according to embodiments of the present disclosure includes a ring containing nitrogen and boron as shown in Formula 1. The polycyclic compound may include two rings each including boron and a chalcogen such as, for example, oxygen or sulfur. For example, in embodiments of the polycyclic compound, the carbon atom adjacent to either boron atom is directly or indirectly cross-linked with a chalcogen such as, for example, oxygen and/or sulfur to form a condensed polycyclic compound.

In an embodiment, ring D to ring F of Formula 1 may be each independently a substituted or unsubstituted aryl group having 6 to 30 carbon atoms for forming a ring.

In an embodiment, $Y_1$ and $Y_2$ of Formula 1 may be the same. For example, $Y_1$ and $Y_2$ may be each independently oxygen.

In an embodiment, Formula 1 may be represented by the following Formula 2:

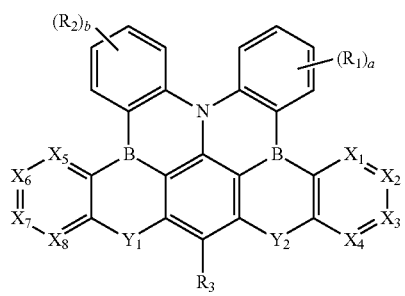

Formula 2

In Formula 2, $X_1$ to $X_8$ may be each independently N or $CR_A$.

In Formula 2, $R_1$ to $R_3$ and $R_A$ may be each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a ring.

In Formula 2, "a" and "b" may be each independently an integer of 0 to 4. Meanwhile, if "a" is 2 or more, a plurality of $R_1$ groups may be the same or different, and if "b" is 2 or more, a plurality of $R_2$ groups may be the same or different.

In Formula 2, $Y_1$ and $Y_2$ are the same as defined in Formula 1.

In an embodiment, all $X_1$ to $X_8$ in Formula 2 may be $CR_A$. In this case, Formula 2 may be represented by the following Formula 3:

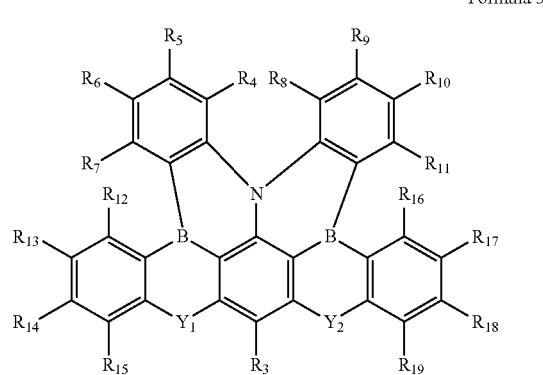

Formula 3

In Formula 3, $R_4$ to $R_{19}$ may be each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, a substituted or unsubstituted heteroaryl group having 2 to 30 carbon atoms for forming a ring, or combined with an adjacent group to form a ring.

In Formula 3, $Y_1$, $Y_2$, and $R_3$ are the same as defined in Formula 2.

In an embodiment, the groups in at least one pair among $R_4$ and $R_9$, $R_5$ and $R_6$, $R_6$ and $R_7$, $R_8$ and $R_9$, $R_9$ and $R_{10}$, $R_{10}$ and $R_{11}$, $R_{12}$ and $R_{13}$, $R_{13}$ and $R_{14}$, $R_{14}$ and $R_{15}$, $R_{16}$ and $R_{17}$, $R_{17}$ and $R_{18}$, and $R_{18}$ and $R_{19}$ may be combined with each other to form a ring represented by any one among the following Formula 4-1 to Formula 4-4:

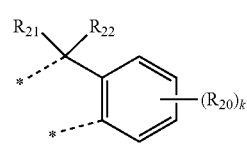

Formula 4-1

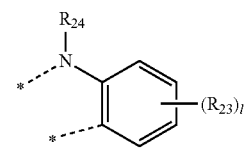

Formula 4-2

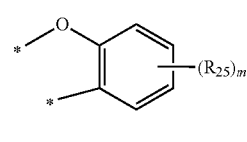

Formula 4-3

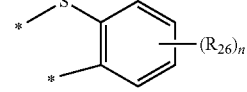

Formula 4-4

In Formula 4-1 to Formula 4-4, $R_{20}$ to $R_{26}$ may be each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring.

In Formula 4-1 to Formula 4-4, "k" to "n" are each independently an integer of 0 to 4. Meanwhile, if "k" is 2 or more, a plurality of $R_{20}$ groups are the same or different, if "l" is 2 or more, a plurality of $R_{23}$ groups are the same or different, if "m" is 2 or more, a plurality of $R_{25}$ groups are the same or different, and if "n" is 2 or more, a plurality of $R_{26}$ groups are the same or different.

In an embodiment, at least one pair among $R_4$ and $R_9$, $R_7$ and $R_{12}$, and $R_{11}$ and $R_{16}$ of Formula 3 may be combined with —O— or —S— to form a ring.

For example, in a case where $R_4$ and Ra of Formula 3 are combined with —O— or —S— to form a ring, Formula 3 may be represented by Formula 5-1, in a case where $R_7$ and $R_{12}$ of Formula 3 are combined with —O— or —S— to form a ring, Formula 3 may be represented by Formula 5-2, and in a case where $R_{11}$ and $R_{16}$ of Formula 3 are combined with —O— or —S— to form a ring, Formula 3 may be represented by Formula 5-3. However, embodiments of the present disclosure are not limited thereto, and two or more pairs among $R_4$ and $R_9$, $R_7$ and $R_{12}$, and $R_{11}$ and $R_{16}$ may be combined with —O— or —S— to form rings.

Formula 5-1

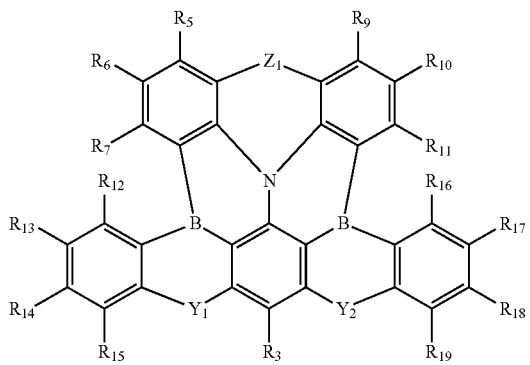

Formula 5-2

Formula 5-3

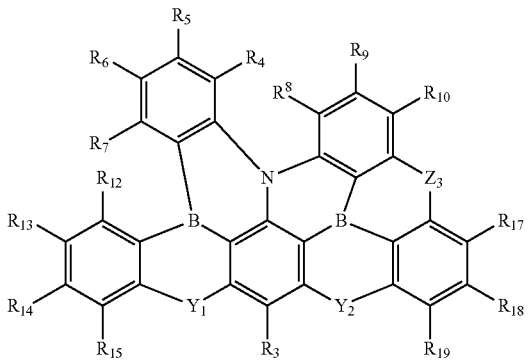

In Formula 5-1 to Formula 5-3, $Z_1$ to $Z_3$ may be each independently O or S.

In Formula 5-1 to formula 5-3, $R_3$ to $R_{19}$, $Y_1$ and $Y_2$ are the same as defined in Formula 3.

The polycyclic compound of an embodiment, represented by Formula 1 may be a material configured to emit delayed fluorescence. The polycyclic compound of an embodiment may be a material configured to provide thermally activated delayed fluorescence. For example, the polycyclic compound represented by Formula 1 may be used as a blue emitting material configured to emit thermally activated delayed fluorescence. However, embodiments of the present disclosure are not limited thereto.

The polycyclic compound of an embodiment may be used as a material for thermally activated delayed fluorescence configured to emit green light or red light.

The polycyclic compound of an embodiment, represented by Formula 1 may be any one among the compounds represented in the following Compound Group 1:

Compound Group 1

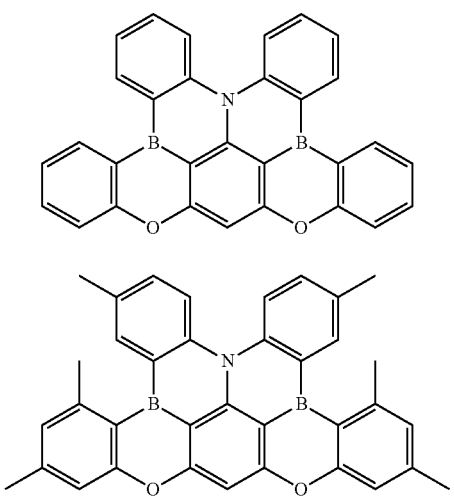

3
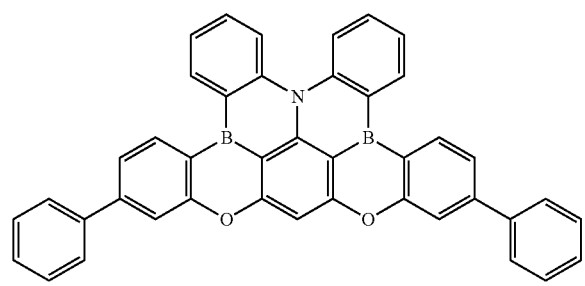
4
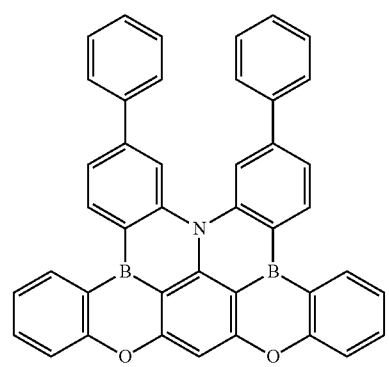
5
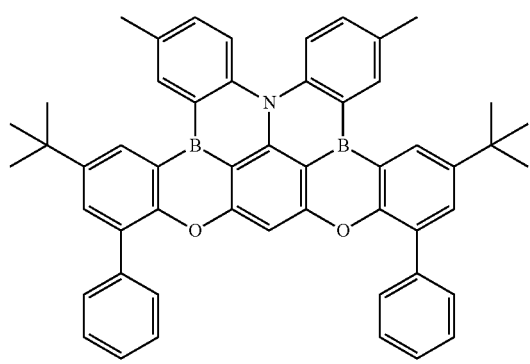
6
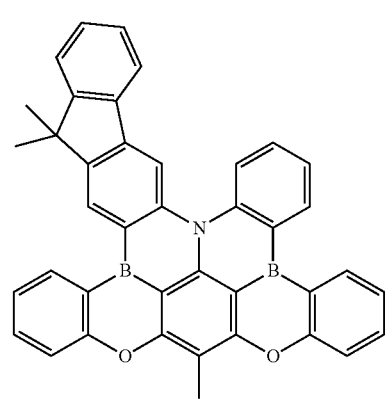
7
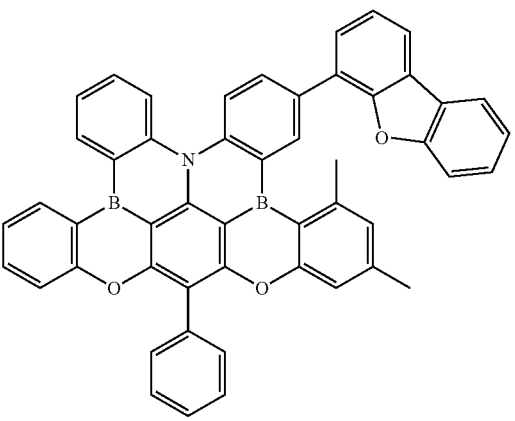
8
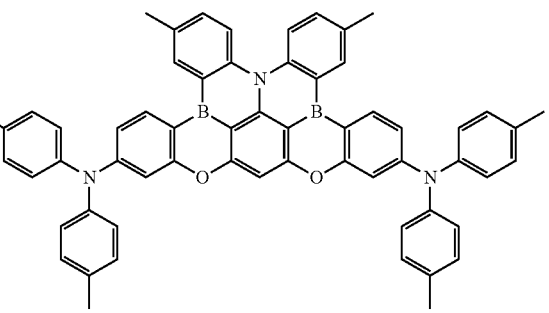
9
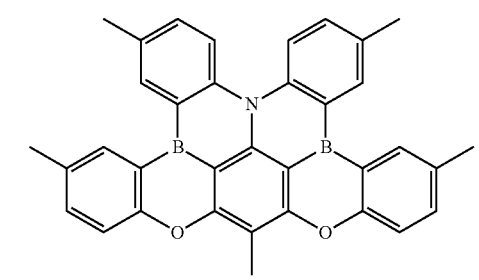
10
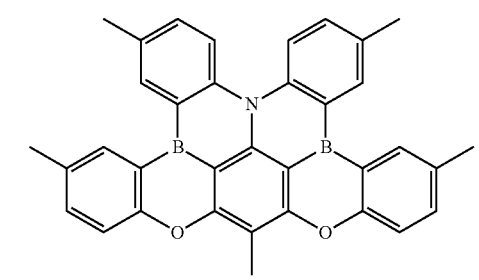
11
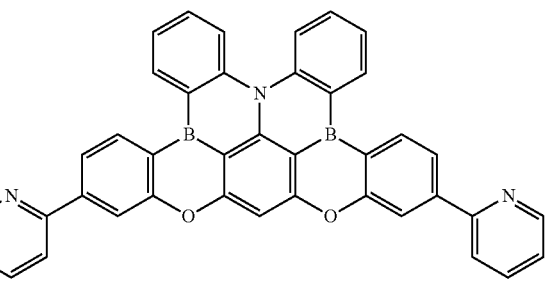

-continued
12
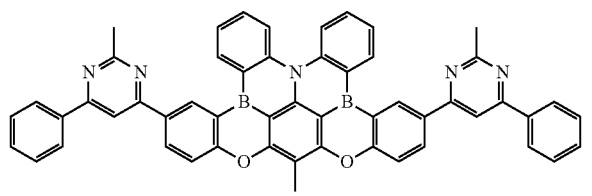
13
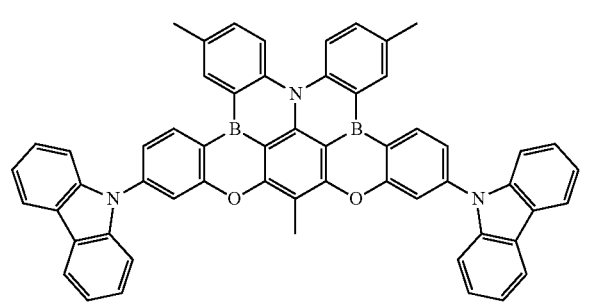
14
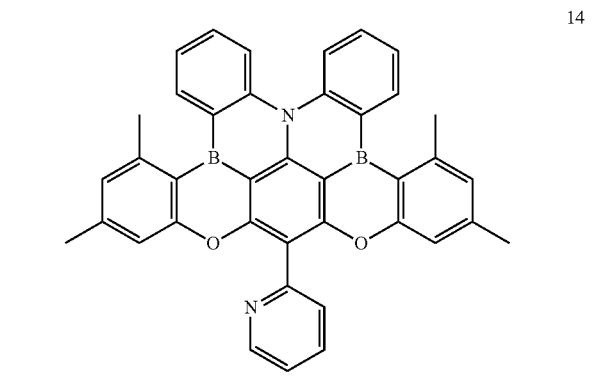
15
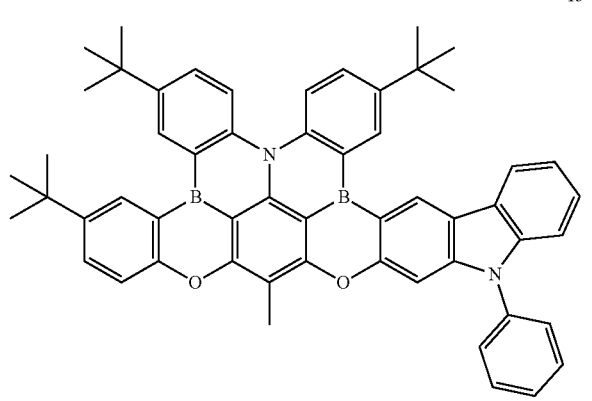
16
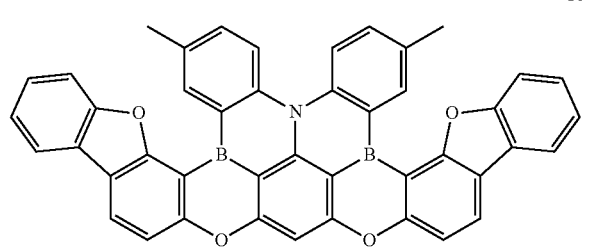
-continued
17
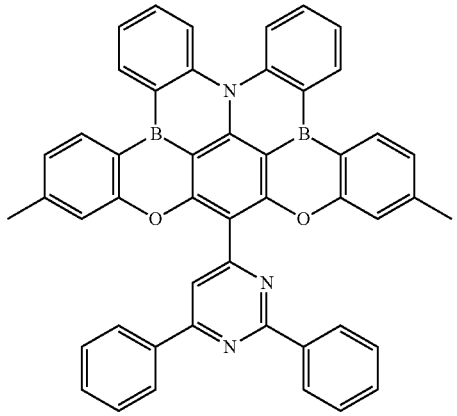
18
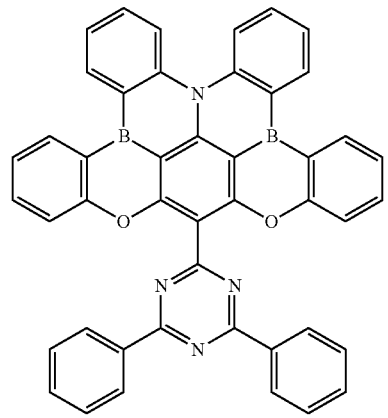
19
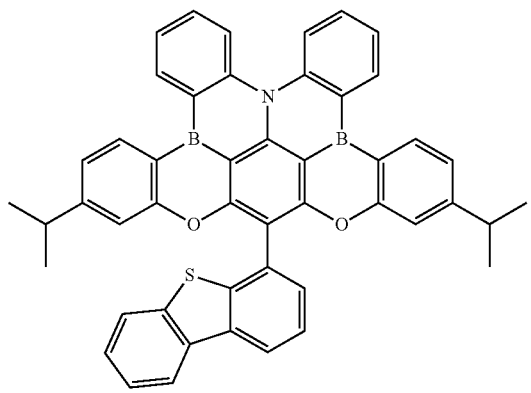
20
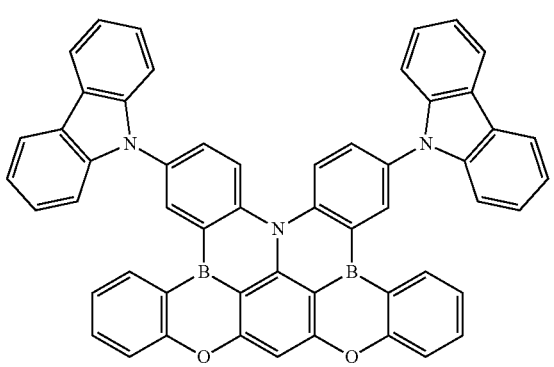

21
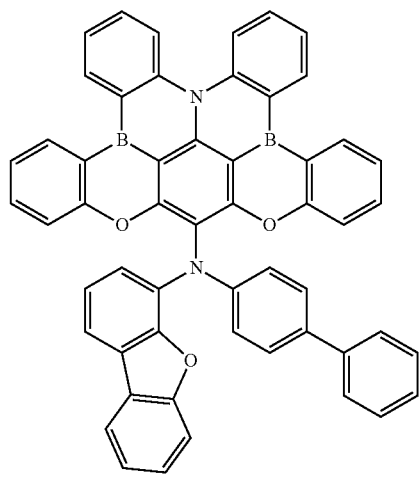
22
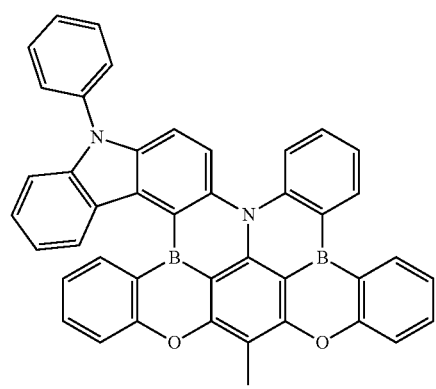
23
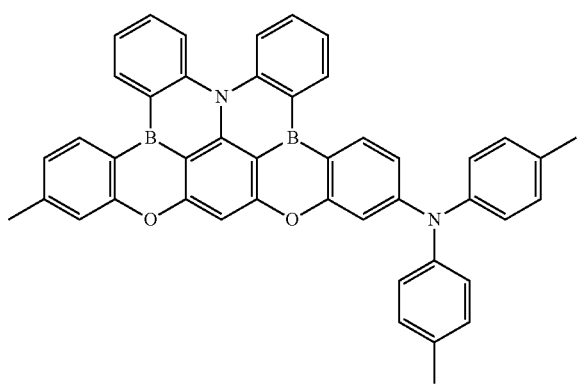
24
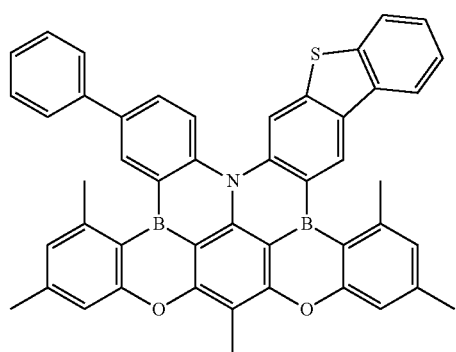
25
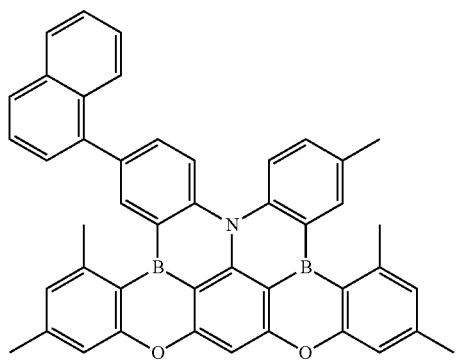
26
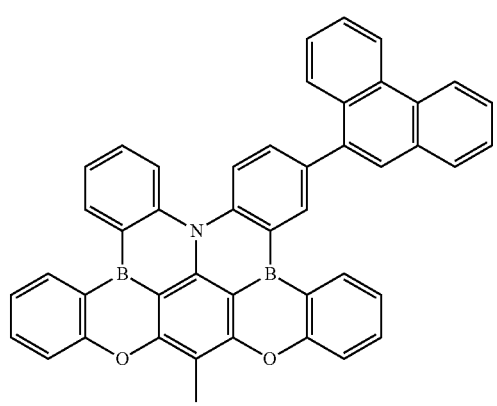
27
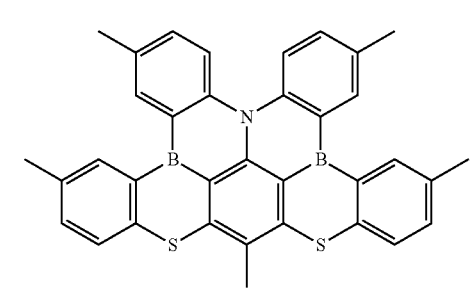
28
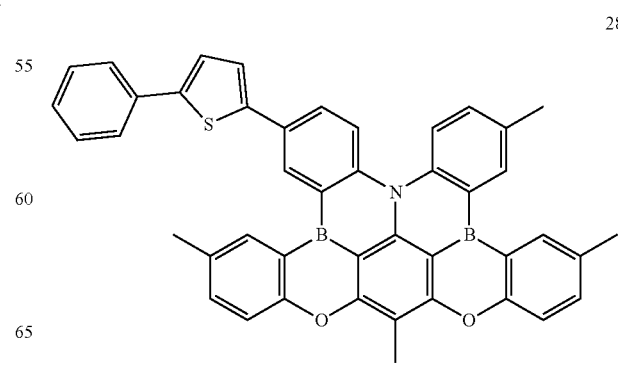

29
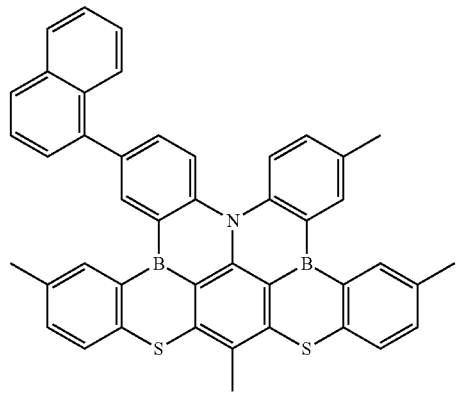
30
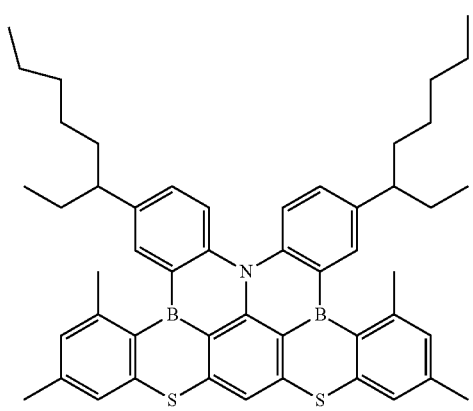
31
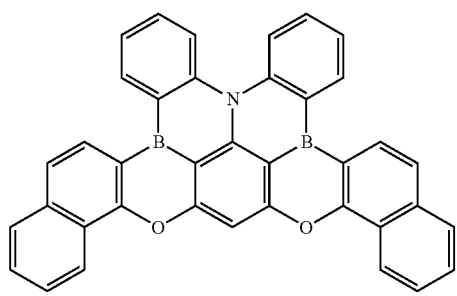
32
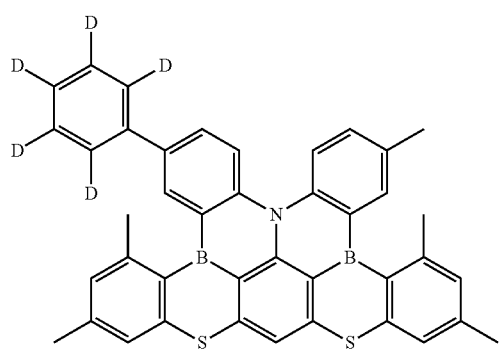
33
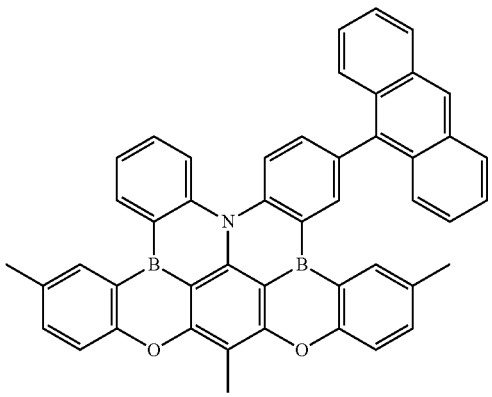
34
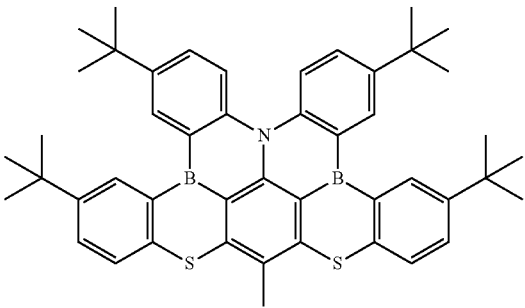
35
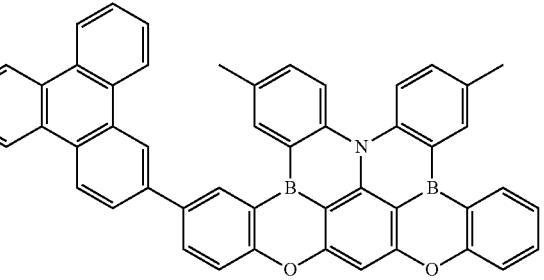
36
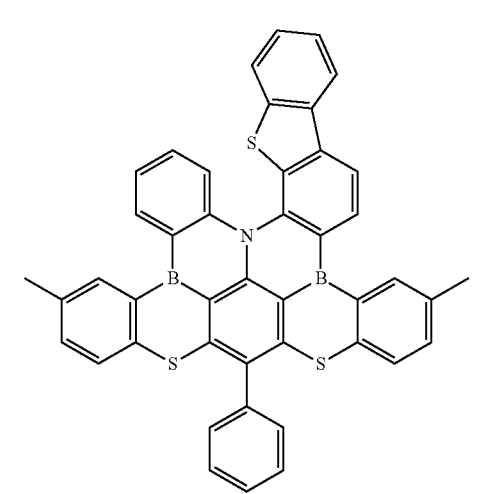

-continued

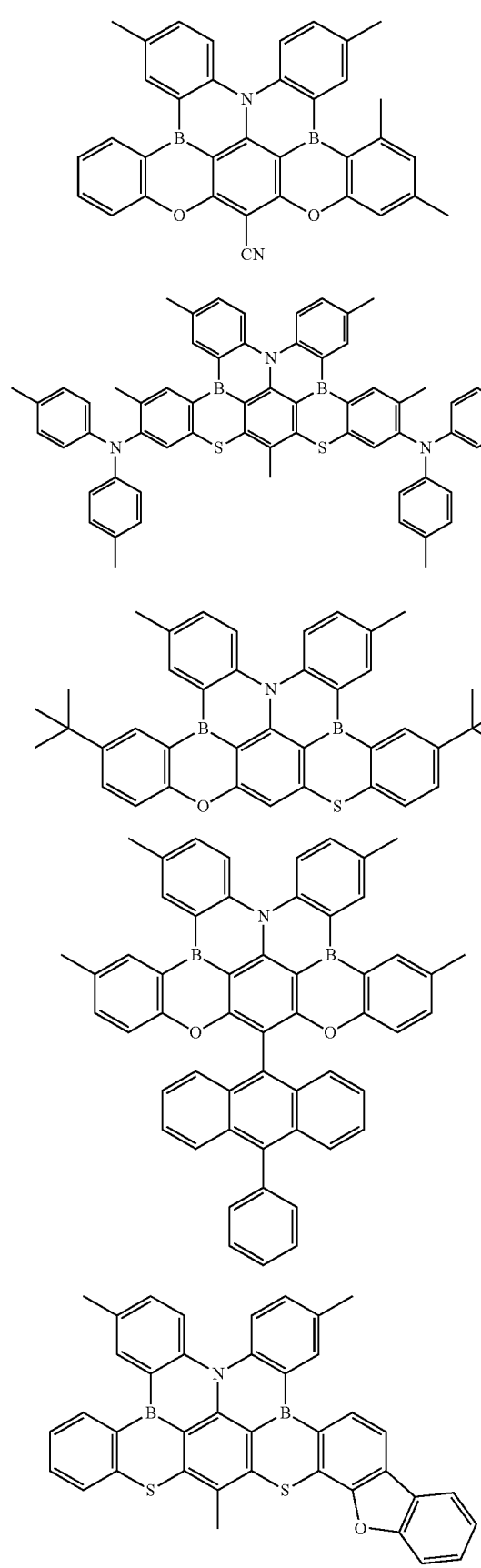

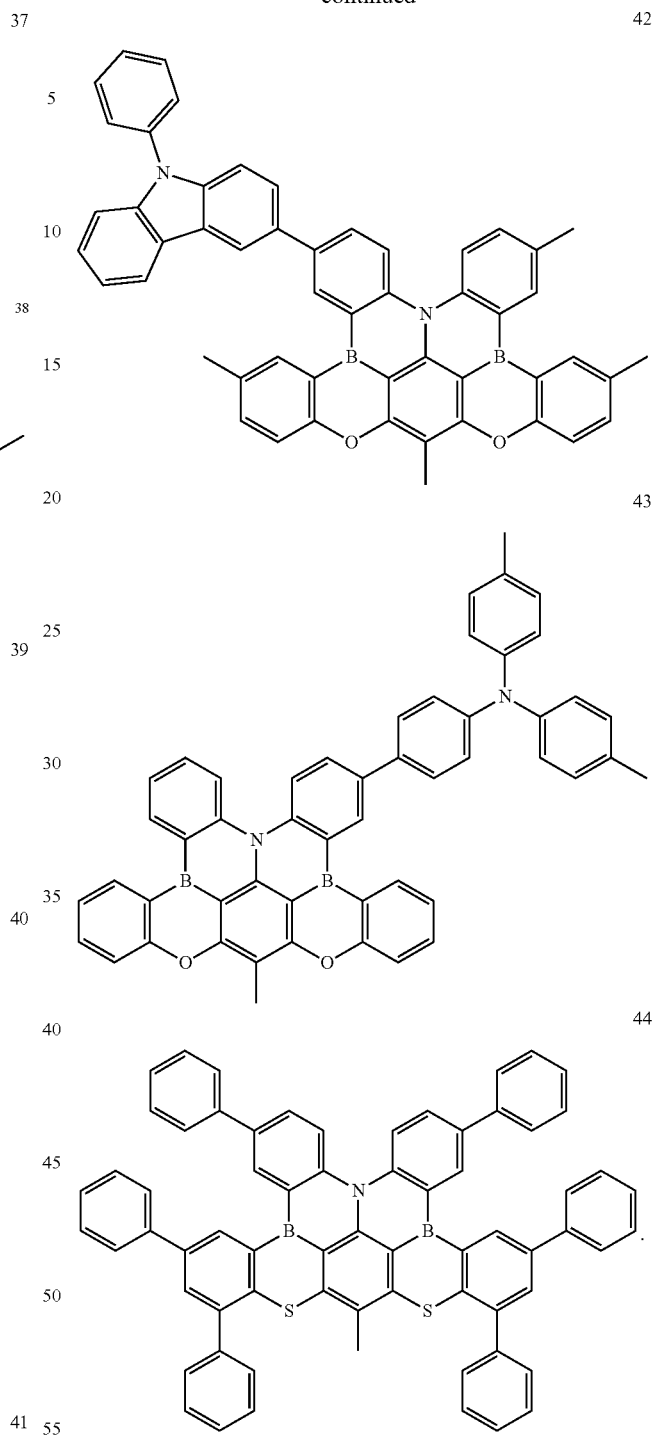

The polycyclic compound represented by Formula 1 is used in the organic electroluminescence device 10 of an embodiment and may improve the efficiency and life of the organic electroluminescence device. In some embodiments, the polycyclic compound represented by Formula 1 is used in the emission layer EML of the organic electroluminescence device 10 of an embodiment and may improve the emission efficiency and life of the organic electroluminescence device.

In an embodiment, the emission layer EML includes a host and a dopant, and the host may be a host configured to emit delayed fluorescence and the dopant may be a dopant configured to emit delayed fluorescence. Meanwhile, the polycyclic compound of an embodiment, represented by Formula 1 may be included as a dopant material of an emission layer EML. For example, the polycyclic compound of an embodiment, represented by Formula 1 may be used as a TADF dopant.

Meanwhile, in an embodiment, the emission layer EML may include any suitable host material available in the art. For example, in an embodiment, the emission layer EML may include, as a host material, tris(8-hydroxyquinolino) aluminum (Alq$_3$), 4,4'-bis(N-carbazolyl)-1,1'-biphenyl (CBP), 3,3'-bis(N-carbazolyl)-1,1'-biphenyl (mCBP), poly (N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2, 2'-dimethyl-biphenyl (CDBP), 2-methyl-9,10-bis(naphthalen-2-yl)anthracene (MADN), bis[2-(diphenylphosphino) phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc. However, embodiments of the present disclosure are not limited thereto. Any suitable host materials available in the art configured to emit delayed fluorescence, in addition to the host materials disclosed herein may be included.

Meanwhile, in the organic electroluminescence device 10 of an embodiment, the emission layer EML may further include any suitable dopant material available in the art. In an embodiment, the emission layer EML may include as a dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl) vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

Referring to FIGS. 1 to 3 again, in the organic electroluminescence device 10 of an embodiment, the electron transport region ETR is provided on the emission layer EML. The electron transport region ETR may include at least one selected from an electron blocking layer, an electron transport layer ETL and an electron injection layer EIL. However, embodiments of the present disclosure are not limited thereto.

The electron transport region ETR may have a single layer formed using a single material, a single layer formed using a plurality of different materials, or a multilayer structure having a plurality of layers formed using the same or a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL, without limitation. The thickness of the electron transport region ETR may be, for example, from about 100 Å to about 1,500 Å.

The electron transport region ETR may be formed using various suitable methods such as, for example, a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include, for example, tris(8-hydroxyquinolinato)aluminum (Alq$_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof, without limitation.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, suitable or satisfactory electron transport properties may be obtained without substantial increase of a driving voltage.

If the electron transport region ETR includes the electron injection layer EIL, the electron transport region ETR may include, for example, a metal halide such as LiF, NaCl, CsF, RbCl, RbI, and/or KI, a metal in lanthanides such as Yb, a metal Oxide such as Li$_2$O, BaO, and/or lithium quinolate (LiQ). However, embodiments of the present disclosure are not limited thereto. The electron injection layer EIL also may be formed using a mixture material of an electron transport material and an insulating organo metal salt (e.g., an organometallic salt). The organo metal salt may be a material having an energy band gap of about 4 eV or more. In some embodiments, the organo metal salt may include, for example, metal acetates, metal benzoates, metal acetoacetates, metal acetylacetonates, and/or metal stearates.

If the electron transport region ETR includes the electron injection layer EIL, the thickness of the electron injection layer EIL may be from about 1 Å to about 100 Å, and from about 3 Å to about 90 Å. If the thickness of the electron injection layer EIL satisfies the above described range, suitable or satisfactory electron injection properties may be obtained without inducing substantial increase of a driving voltage.

The electron transport region ETR may include a hole blocking layer as described above. The hole blocking layer may include, for example, at least one selected from 2,9-dimethyl-4,7-diphenyl-1,10-phenanthroline (BCP), or 4,7-diphenyl-1,10-phenanthroline (Bphen). However, embodiments of the present disclosure are not limited thereto.

The second electrode EL2 is provided on the electron transport region ETR. The second electrode EL2 has conductivity (e.g., is electrically conductive). The second electrode EL2 may be formed using a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, and/or the like.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, and/or the like.

In some embodiments, the second electrode EL2 may be coupled with an auxiliary electrode. If the second electrode EL2 is coupled with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission type (or kind), the first electrode EL1 may be a reflective electrode and the second electrode EL2 may be a transmissive electrode or a transflective electrode. If the organic electroluminescence device 10 is a bottom emission type (or kind), the first electrode EL1 may be a transmissive electrode or a transflective electrode and the second electrode EL2 may be a reflective electrode.

The organic electroluminescence device 10 of an embodiment of the present disclosure uses the polycyclic compound as a material for an emission layer and may have improved emission efficiency and life characteristics.

An embodiment of the present disclosure provides a polycyclic compound represented by the following Formula 1:

Formula 1

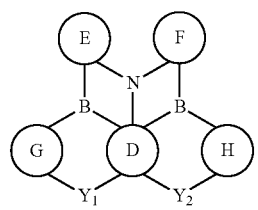

In Formula 1, ring D to ring H are each independently a substituted or unsubstituted aryl group having 6 to 30 carbon atoms for forming a ring, or a substituted or unsubstituted heteroaryl group having 2 to 30 carbon atoms for forming a ring.

In Formula 1, $Y_1$ and $Y_2$ are each independently O or S.

The same explanation on the polycyclic compound in the organic electroluminescence device of an embodiment may be applied to the polycyclic compound of an embodiment, represented by Formula 1.

The polycyclic compound according to an embodiment may be any one selected from the compounds represented in Compound Group 1 above.

Hereinafter, the subject matter of the present disclosure will be explained with reference to examples and compara-tive examples. The following embodiments are only illustrations to assist the understanding of the present disclosure, and the scope of the present disclosure is not limited thereto.

Examples

1. Synthesis of Polycyclic Compounds

First, the synthetic method of the polycyclic compound according to an embodiment of the present disclosure will be explained with reference to the synthetic methods of Compound 5, Compound 10, and Compound 15. In addition, the synthetic methods of the polycyclic compounds explained below are only embodiments, and the synthetic method of the polycyclic compound according to embodiments of the present disclosure is not limited thereto.

(1) Synthesis of Compound 5

Synthesis of A-3

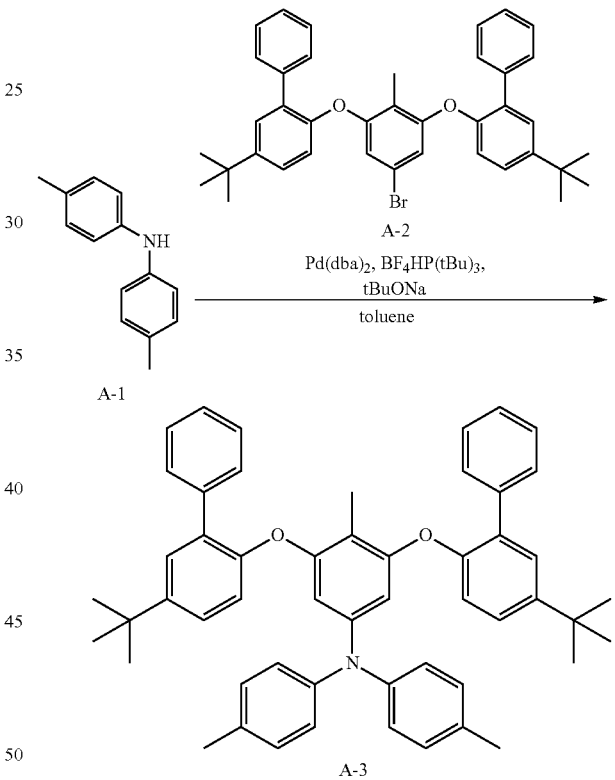

Compound A-1 (2.0 g, 10 mmol), Compound A-2 (6.9 g, 11 mmol), Pd(dba)$_2$ (0.19 g, 0.21 mmol), BF$_4$PH(tBu)$_3$ (0.24 g, 0.81 mmol), NaOtBu (1.2 g, 13 mmol), and 50 ml of toluene were stirred under an Ar atmosphere at about 80° C. for about 4 hours, followed by filtering through a pad of silica gel using a toluene solvent. The reaction solution thus obtained was concentrated, and silica gel column chromatography (eluent: hexane and toluene) was performed. Then, recrystallization was performed using a mixed solvent of hexane and toluene to obtain 6.1 g of a white solid in 82% yield. The molecular weight of the compound thus obtained was measured by fast atom bombardment-mass spectrometry ("FAB-MS") and was found to be 736, and the compound was identified as Target Compound A-3.

Synthesis of Compound 5

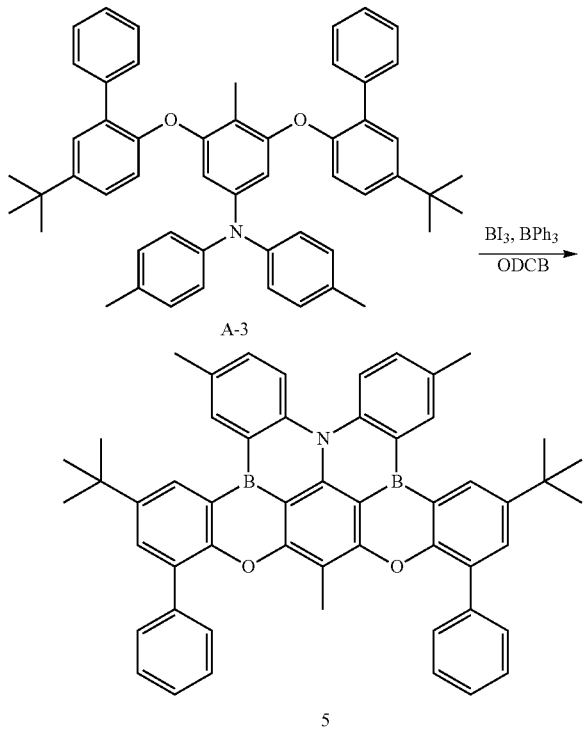

Compound A-3 (2.0 g, 2.8 mmol), triphenylboran (1.3 g, 5.4 mmol), and 30 ml of o-dichlorobenzene ("ODCB") were stirred under an Ar atmosphere. Borontriiodide (2.7 g, 6.8 mmol) was added thereto, followed by heating and stirring at about 180° C. for about 24 hours. Then, the resultant product was cooled to room temperature and a phosphate buffer was added thereto. The resultant product was extracted with toluene, dried with MgSO₄, and filtered through a silica gel pad using a toluene solvent. Then, washing by ultrasonic wave using a mixed solvent of hexane and toluene and recrystallization with toluene were performed to obtain 1.2 g of a yellow solid in 60% yield. The molecular weight of the compound thus obtained was measured by FAB-MS and was found to be 752, and the compound was identified as Target Compound 5.

(2) Synthesis of Compound 10

Synthesis of B-2

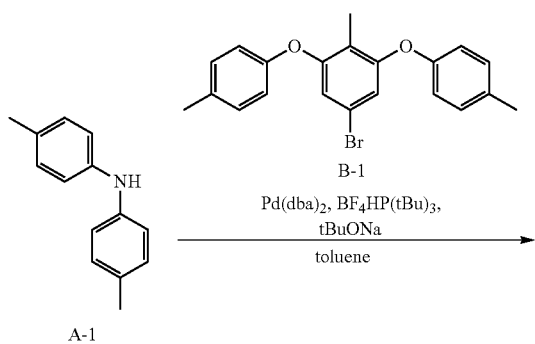

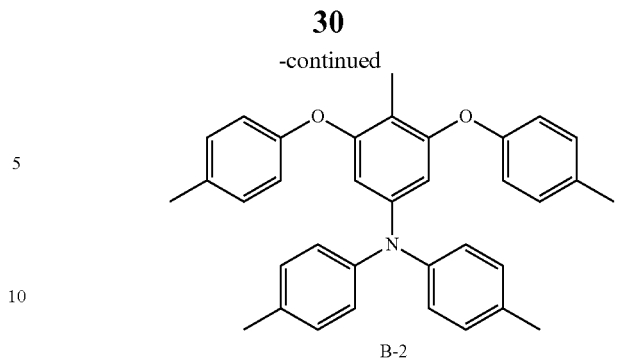

Compound B-2 was synthesized by substantially the same procedure for synthesizing Compound A-3, except that the synthesis was performed using Compound B-1 (4.3 g, 11 mmol) instead of Compound A-2. The reaction solution thus obtained was concentrated, and silica gel column chromatography (eluent: hexane and toluene) was performed. Then, recrystallization was performed using a mixed solvent of hexane and toluene to obtain 4.0 g of a white solid in 78% yield. The molecular weight of the compound thus obtained was measured by FAB-MS and was found to be 500, and the compound was identified as Target Compound B-2.

Synthesis of Compound 10

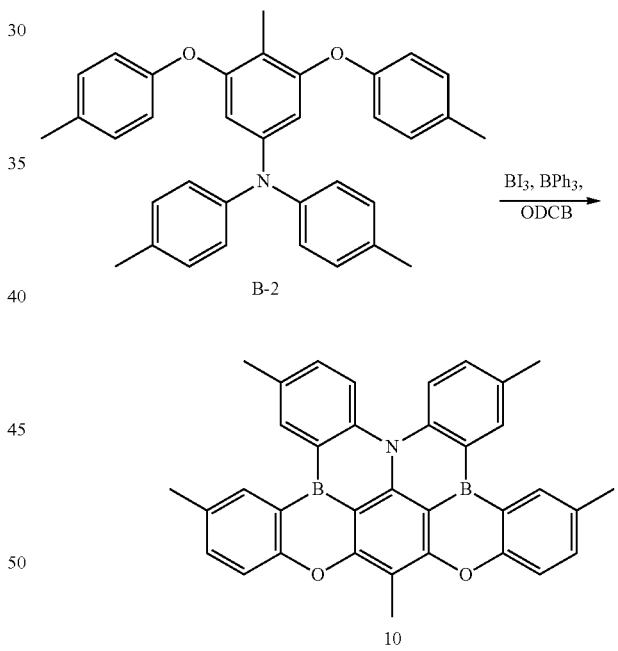

Compound 10 was synthesized by substantially the same procedure for synthesizing Compound 5, except that the synthesis was performed using Compound B-2 (2.0 g, 4.0 mmol) instead of Compound A-3. Then, the resultant product was cooled to room temperature and a phosphate buffer was added thereto. The resultant product was extracted with toluene, washed by ultrasonic wave using a mixed solvent of hexane and toluene and recrystallized with toluene to obtain 1.2 g of a yellow solid in 60% yield. The molecular weight of the compound thus obtained was measured by FAB-MS and was found to be 515, and the compound was identified as Target Compound 10.

(3) Synthesis of Compound 15
Synthesis of Compound C-3

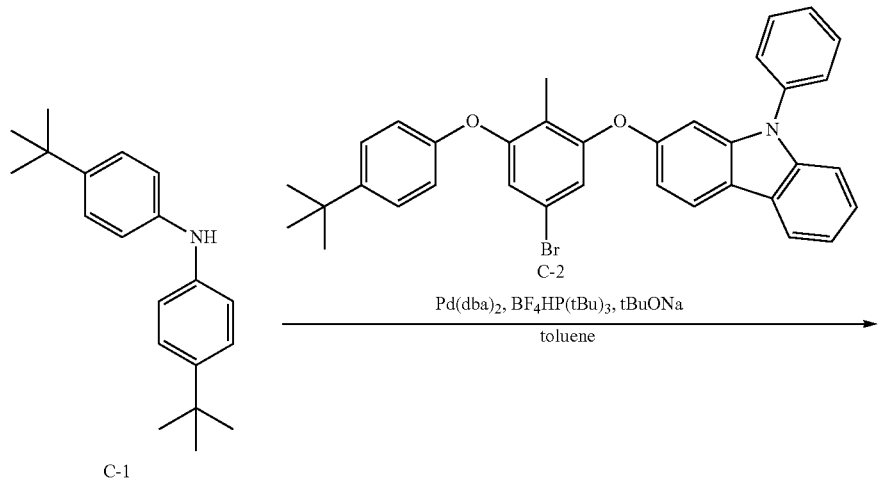

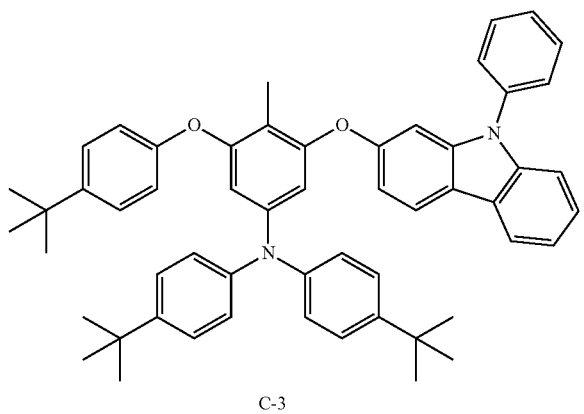

Compound C-3 was synthesized by substantially the same procedure for synthesizing Compound A-3, except that the synthesis was performed using Compound C-1 (2.0 g, 6.8 mmol) and Compound C-2 (4.3 g, 7.5 mmol) instead of Compound A-1 and Compound A-2, respectively. The reaction solution thus obtained was concentrated, and silica gel column chromatography (eluent: hexane and toluene) was performed. Then, recrystallization was performed using a mixed solvent of hexane and toluene to obtain 4.2 g of a white solid in 79% yield. The molecular weight of the compound thus obtained was measured by FAB-MS and was found to be 777, and the compound was identified as Target Compound C-3.

Synthesis of Compound 15

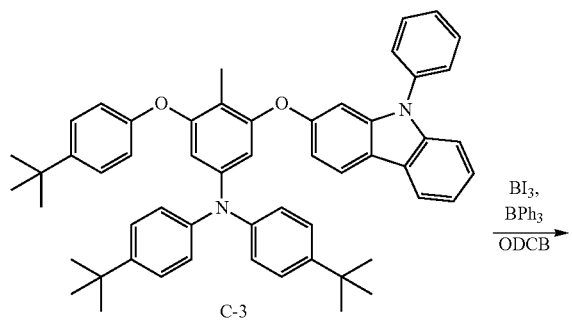

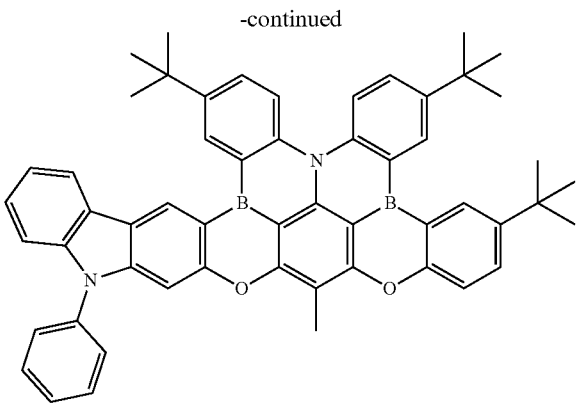

Compound 15 was synthesized by substantially the same procedure for synthesizing Compound 5, except that the synthesis was performed using Compound C-3 (2.0 g, 2.6 mmol) instead of Compound A-3. Then, the resultant product was cooled to room temperature and a phosphate buffer was added thereto. The resultant product was extracted with toluene and washed by ultrasonic wave using a mixed solvent of hexane and toluene. Then, recrystallization was performed using toluene to obtain 1.7 g of a yellow solid in 81% yield. The molecular weight of the compound thus obtained was measured by FAB-MS and was found to be 793, and the compound was identified as Target Compound 15.

2. Manufacture and Evaluation of Organic Electroluminescence Device Including a Polycyclic Compound.

Manufacture of Organic Electroluminescence Device

Organic electroluminescence devices of exemplary embodiments including the polycyclic compounds of exemplary embodiments in an emission layer were manufactured by a method described below. Organic electroluminescence devices of Examples 1 to 3 were manufactured using the polycyclic compounds of Compound 5, Compound 10, and Compound 15, respectively, as materials for an emission layer. Compounds used in the emission layer in Examples 1 to 3 and Comparative Examples 1 to 3 (Comparative Compound X-1, Comparative Compound, X-2, and Comparative Compound X-3, respectively) are shown below.

Example Compounds

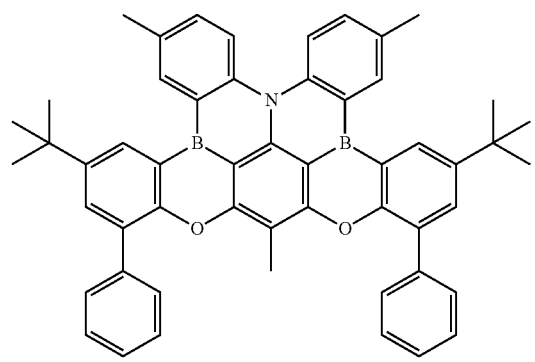

10

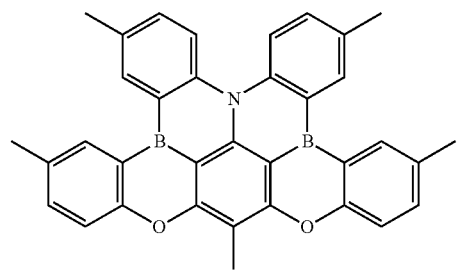

15

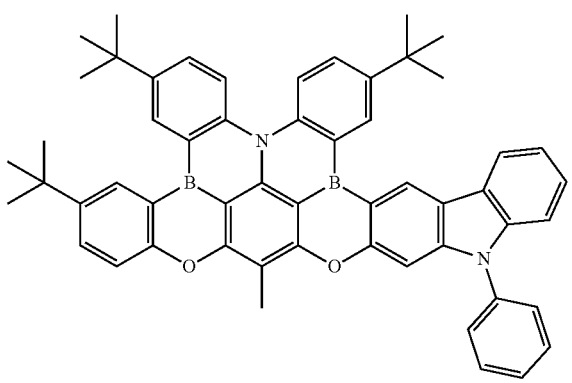

Comparative Compounds

X-1

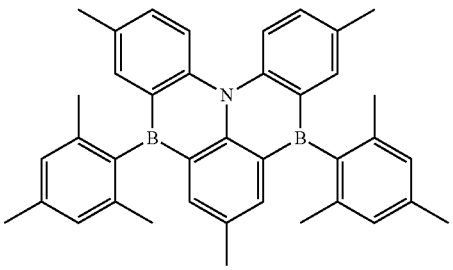

X-2

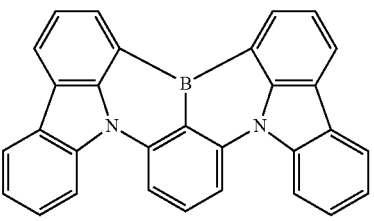

X-3

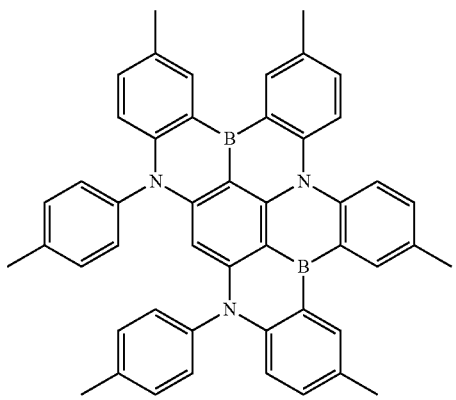

The organic electroluminescence devices of the Examples and the Comparative Examples were manufactured by a method described below.

On a glass substrate, ITO with a thickness of about 1,500 Å was patterned and washed with ultra-pure water, and a UV ozone treatment was conducted for about 10 minutes. Then, HAT-CN was deposited to a thickness of about 100 Å, α-NPD was deposited to a thickness of about 800 Å, and mCP was deposited to a thickness of about 50 Å to form a hole transport region.

Then, each of the polycyclic compounds of embodiments and the Comparative Compounds, and mCBP were co-deposited in a ratio of 1:99 to form an emission layer to a thickness of about 200 Å. That is, in order to form the emission layer by the co-deposition, each of Compounds 5, 10 and 15 was mixed with mCBP and deposited in Examples 1 to 3, and each of Comparative Compounds X-1, X-2, and X-3 was mixed with mCBP and deposited in Comparative Examples 1 to 3.

On the emission layer, a layer was formed using TPBi to a thickness of about 300 Å, and a layer was formed using LiF to a thickness of about 5 Å to form an electron transport region. Then, a second electrode was formed using aluminum (Al) to a thickness of about 1,000 Å.

In the examples, the hole transport region, the emission layer, the electron transport region and the second electrode were formed by using a vacuum deposition apparatus.

Evaluation of Properties of Organic Electroluminescence Device
Evaluation of Emission Properties A JASCO V-670 spectrometer was used for evaluating properties, and emission spectrum was measured at room temperature and about 77 K by controlling a 5.0 mM toluene solution. The maximum emission wavelength (λmax) of emission spectrum at room temperature and the half width of emission spectrum were confirmed. In addition, from the onset value of emission spectrum at about 77 K, a triplet energy level (T1 energy level) was computed.

TABLE 1

| Compound | $\lambda_{max}$ (nm) | Half width (nm) | T1 (eV) |
| --- | --- | --- | --- |
| Example Compound 5 | 448 | 24 | 2.72 |
| Example Compound 10 | 445 | 23 | 2.78 |
| Example Compound 15 | 451 | 22 | 2.69 |
| Comparative Compound X-1 | 486 | 32 | 2.53 |
| Comparative Compound X-2 | 475 | 25 | 2.57 |
| Comparative Compound X-3 | 461 | 40 | 2.64 |

Evaluation of Device Properties

In order to evaluate the properties of the organic electroluminescence devices of the Examples and the Comparative Examples, the maximum emission wavelength ($\lambda_{max}$), the maximum value of external quantum yield ($EQE_{max}$), and external quantum yield at 1,000 cd/m² ($EQE_{1000\ nit}$) of emission spectrum were evaluated.

TABLE 2

| Device | Emission layer dopant | $\lambda_{max}$ (nm) | $EQE_{max}$ (%) | $EQE_{1000nit}$ (%) |
| --- | --- | --- | --- | --- |
| Example 1 | Example Compound 5 | 454 | 13.7 | 10.4 |
| Example 2 | Example Compound 10 | 451 | 13.2 | 10.1 |
| Example 3 | Example Compound 15 | 462 | 20.4 | 13.6 |
| Comparative Example 1 | Comparative Compound X-1 | 501 | 13.6 | 4.8 |
| Comparative Example 2 | Comparative Compound X-2 | 490 | 12.1 | 4.5 |
| Comparative Example 3 | Comparative Compound X-3 | 462 | 16.3 | 8.6 |

Referring to Table 1, it was found that the polycyclic compounds of embodiments of the disclosure had a smaller half width and higher triplet energy level when compared with the Comparative Compounds. In the polycyclic compound of an embodiment, a carbon atom which is adjacent to a ring including B and N is crosslinked with a chalcogen to form a condensed polycyclic compound. Accordingly, the core structure of the condensed polycyclic compound may be distorted, conjugation of the condensed polycyclic compound may be degraded, the wavelength of light emitted by the condensed polycyclic compound may decrease, and the triplet energy level of the condensed polycyclic compound may increase.

Referring to Table 2, it was found that the organic electroluminescence device using the polycyclic compound of an embodiment as a dopant material of an emission layer achieved increased emission efficiency under high luminance and deepening of the blue color of the emitted light. The condensed polycyclic compound of an embodiment may have a decreased half width, an increased triplet energy level, intersystem crossing may be promoted, emission efficiency of a device including the condensed polycyclic compound may be improved, and emission of deep blue light from the device may be achieved. In addition, the half width of the emitted light is not affected by a chalcogen, and a narrow emission spectrum from the device may be achieved, and thus, an organic electroluminescence device having high efficiency that is capable of emitting light having a deep blue color having high color purity may be provided.

When compared with the Examples, in Comparative Compound X-1, a ring including B and N did not have a crosslinking structure, and the planarity of the core structure of the compound was increased to be very high. Accordingly, the degradation of emission efficiency under high luminance was observed, due to the increase of the wavelength of the maximum emission wavelength and the degradation of the triplet energy level of Comparative Example 1.

In Comparative Compound X-2, a ring including B and N had a crosslinking structure, but the crosslinking was formed only by a single bond, and thus, the planarity of the core structure of the compound was high. Thus, it is thought that the increase of the wavelength of a device and the degradation of emission efficiency under high luminance were observed in Comparative Example 2 like Comparative Example 1.

In Comparative Compound X-3, a ring including B and N formed a crosslinking structure by way of an arylamine group, and due to the crosslinking structure, the distortion of the core structure of the compound was generated and the wavelength was relatively decreased, but the degradation of the triplet energy level was generated due to the conjugation with an aryl group which was substituted for the arylamine group. Thus, an efficiency decrease under high luminance was observed in Comparative Example 3.

The organic electroluminescence device according to an embodiment of the present disclosure may attain high efficiency and long life.

The polycyclic compound according to an embodiment of the present disclosure may improve the life and efficiency of an organic electroluminescence device.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

What is claimed is:

1. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, and oxides thereof, and
wherein the emission layer comprises a polycyclic compound represented by the following Formula 1:

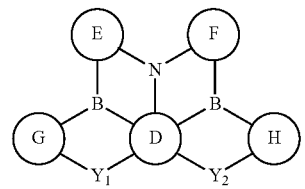

Formula 1 in Formula 1,
ring D to ring H are each independently a substituted or unsubstituted aryl group having 6 to 30 carbon atoms for forming a ring, or a substituted or unsubstituted heteroaryl group having 2 to 30 carbon atoms for forming a ring, and
$Y_1$ and $Y_2$ are each independently O or S.

2. The organic electroluminescence device of claim 1, wherein the emission layer is configured to emit delayed fluorescence.

3. The organic electroluminescence device of claim 1, wherein the emission layer is a delayed fluorescence emission layer comprising a host and a dopant, and the dopant comprises the polycyclic compound.

4. The organic electroluminescence device of claim 1, wherein the emission layer is a thermally activated delayed fluorescence emission layer configured to emit blue light.

5. The organic electroluminescence device of claim 1, wherein ring D to ring F are each independently a substituted or unsubstituted aryl group having 6 to 30 carbon atoms that form a ring.

6. The organic electroluminescence device of claim 1, wherein the polycyclic compound is represented by the following Formula 2:

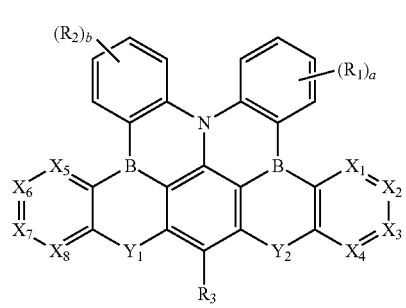

Formula 2 in Formula 2,
$X_1$ to $X_8$ are each independently N or $CR_A$,
$R_1$ to $R_3$ and $R_A$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or combined with an adjacent group to form a ring,
a and b are each independently an integer of 0 to 4, and
$Y_1$ and $Y_2$ are the same as defined in Formula 1.

7. The organic electroluminescence device of claim 6, wherein the polycyclic compound is represented by the following Formula 3:

Formula 3

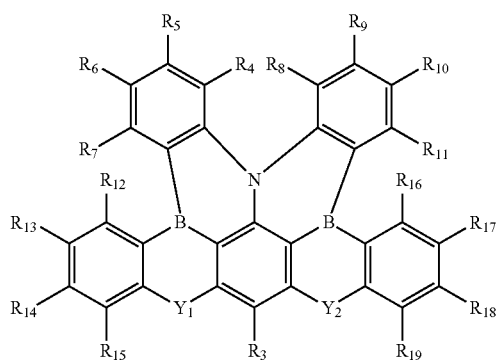

in Formula 3,

R$_4$ to R$_{19}$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or combined with an adjacent group to form a ring, and Y$_1$, Y$_2$, and R$_3$ are the same as defined in Formula 2.

8. The organic electroluminescence device of claim 7, wherein groups in at least one pair among R$_4$ and R$_5$, R$_5$ and R$_6$, R$_6$ and R$_7$, R$_8$ and R$_9$, R$_9$ and R$_{10}$, R$_{10}$ and R$_{11}$, R$_{12}$ and R$_{13}$, R$_{13}$ and R$_{14}$, R$_{14}$ and R$_{15}$, R$_{16}$ and R$_{17}$, R$_{17}$ and R$_{18}$, and R$_{18}$ and R$_{19}$ are combined with each other to form a ring represented by any one among the following Formula 4-1 to Formula 4-4:

Formula 4-1

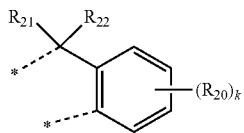

Formula 4-2

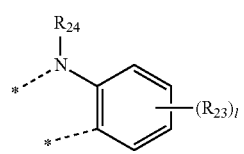

Formula 4-3

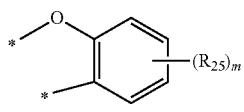

Formula 4-4

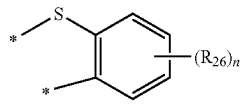

in Formula 4-1 to Formula 4-4,

R$_{20}$ to R$_{26}$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, and k to n are each independently an integer of 0 to 4.

9. The organic electroluminescence device of claim 7, wherein at least one pair among R$_4$ and R$_8$, R$_7$ and R$_{12}$, and R$_{11}$ and R$_{16}$ is combined with —O— or —S— to form a ring.

10. The organic electroluminescence device of claim 7, wherein the polycyclic compound is represented by any one among the following Formula 5-1 to Formula 5-3:

Formula 5-1

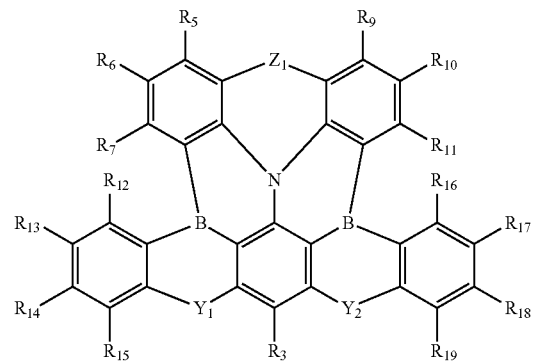

Formula 5-2

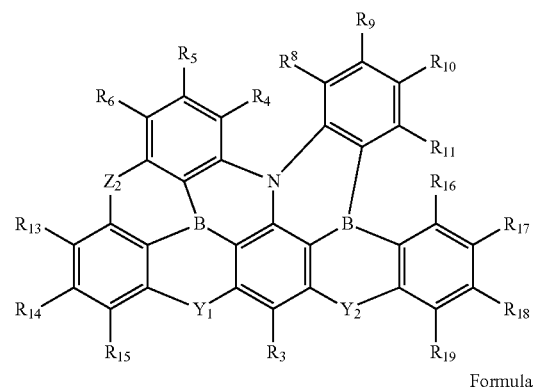

Formula 5-3

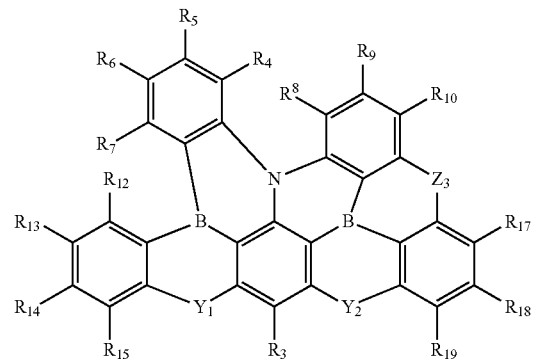

in Formula 5-1 to Formula 5-3,

Z$_1$ to Z$_3$ are each independently O or S, and

R$_3$ to R$_{19}$, Y$_1$ and Y$_2$ are the same as defined in Formula 3.

11. The organic electroluminescence device of claim 1, wherein Y$_1$ and Y$_2$ are the same.

12. The organic electroluminescence device of claim 1, wherein Y$_1$ and Y$_2$ are each independently oxygen.

13. The organic electroluminescence device of claim 1, wherein the compound represented by Formula 1 is any one among compounds represented in the following Compound Group 1:
Compound Group 1
1
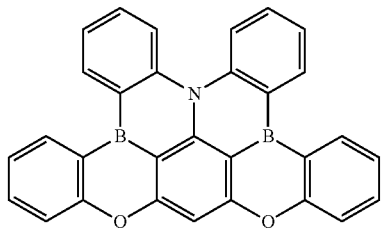
2
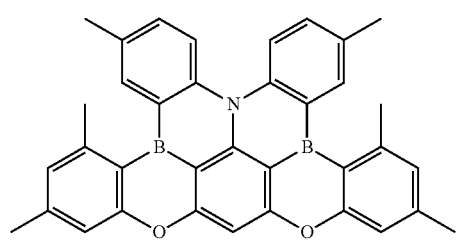
3
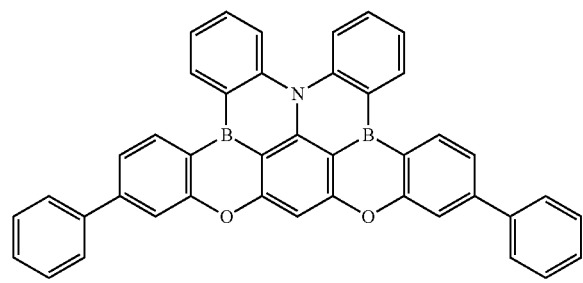
4
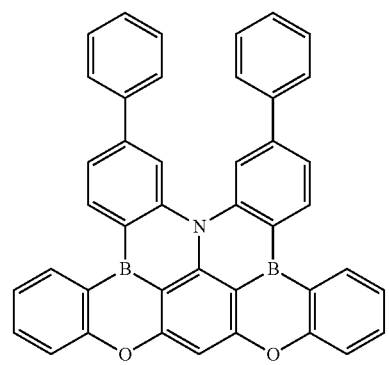
-continued
5
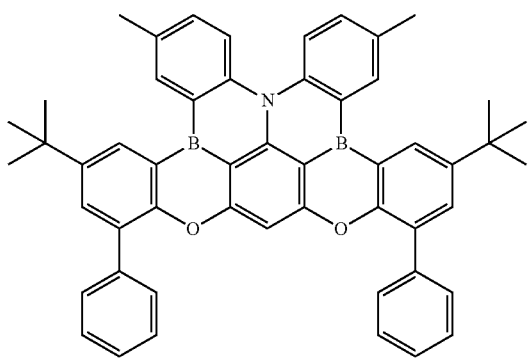
6
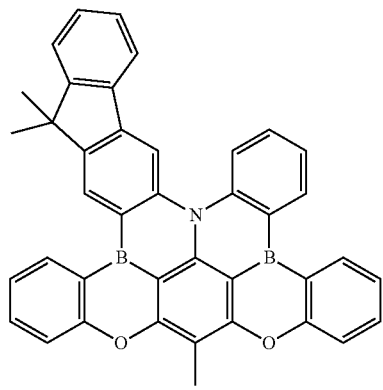
7
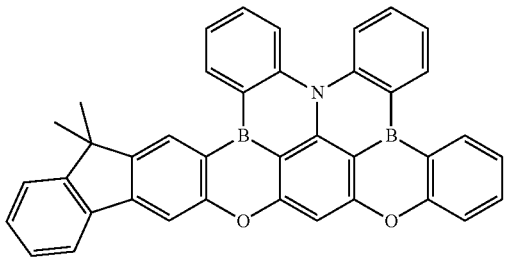
8
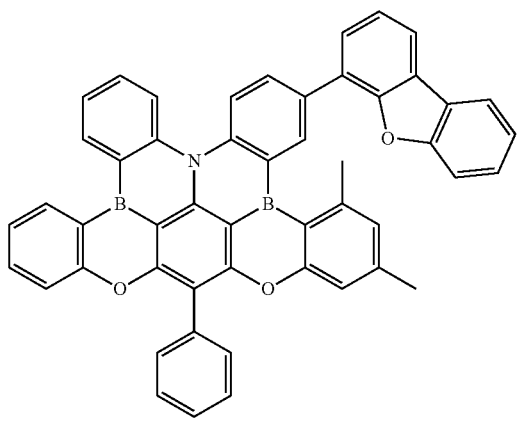

9
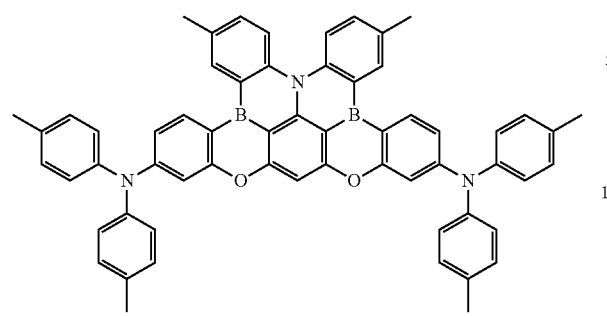
10
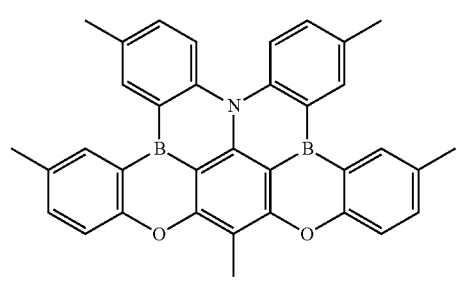
11
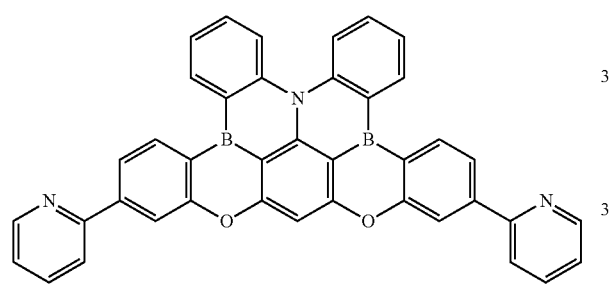
12
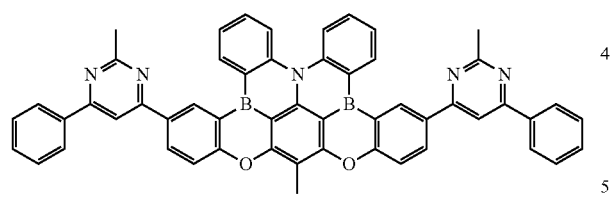
13
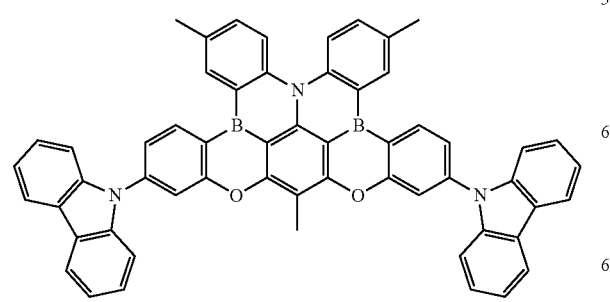
14
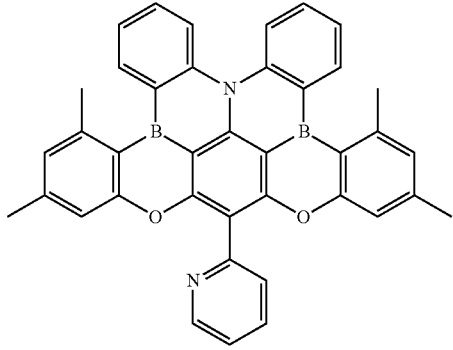
15
16
17
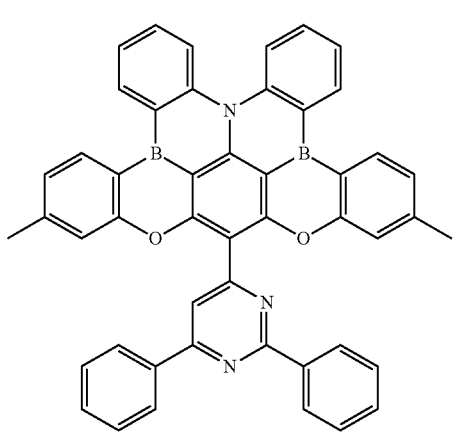

18
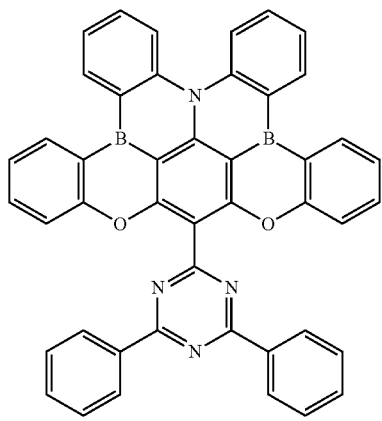
19
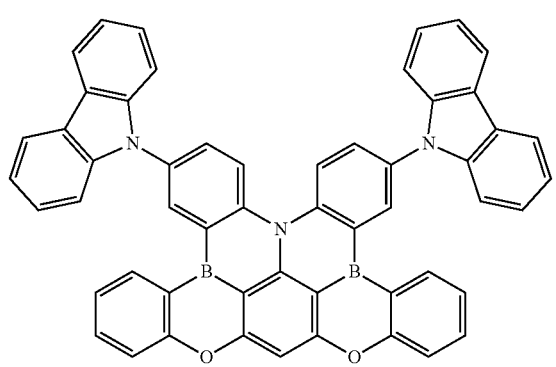
5
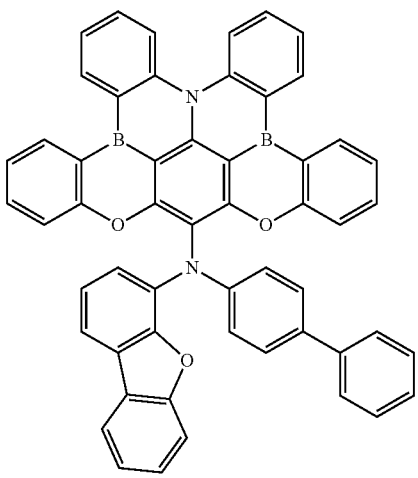
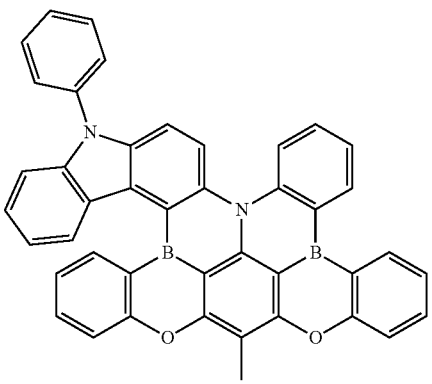
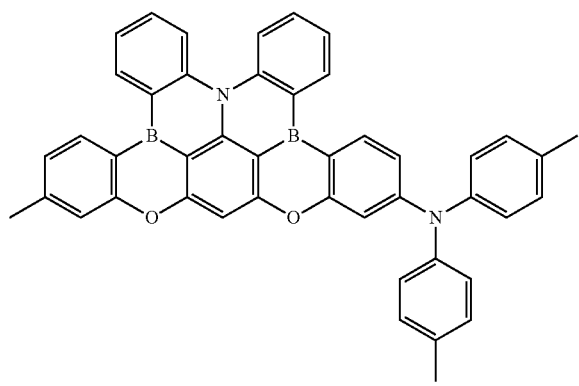
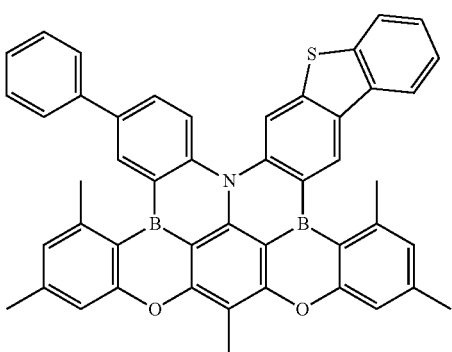

47
-continued
25
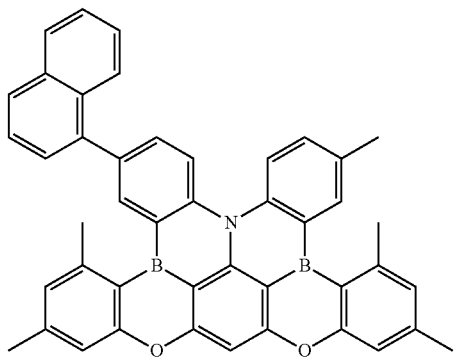
26
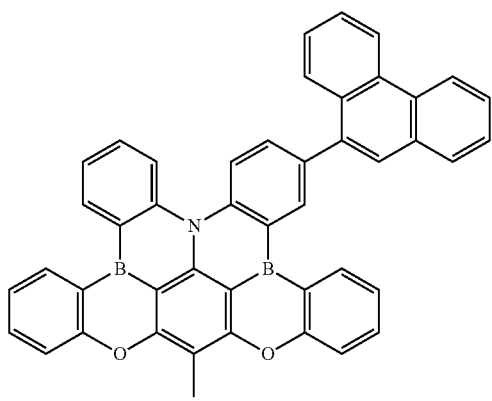
27
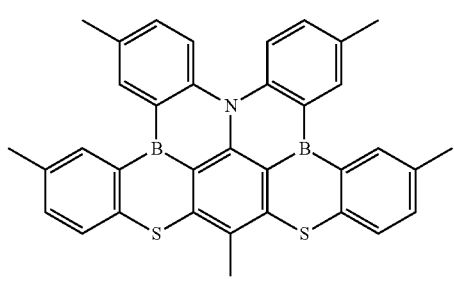
28
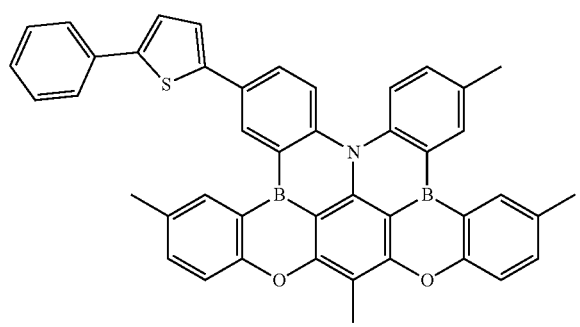
48
-continued
29
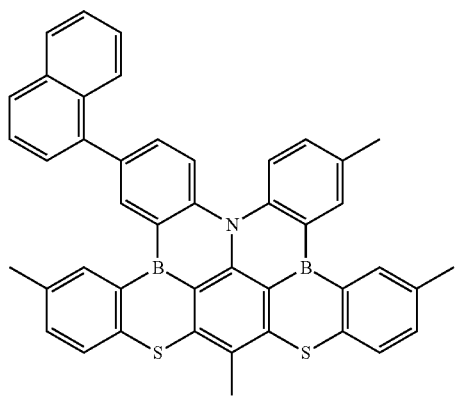
30
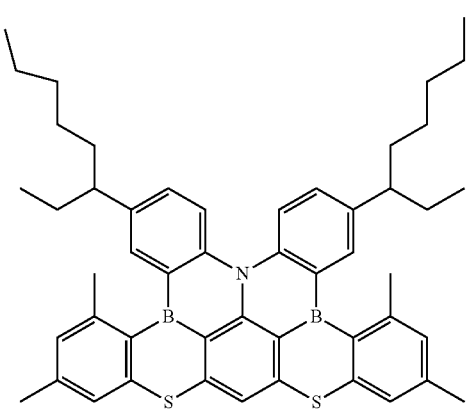
31
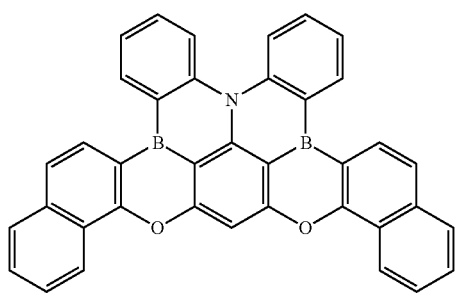
32
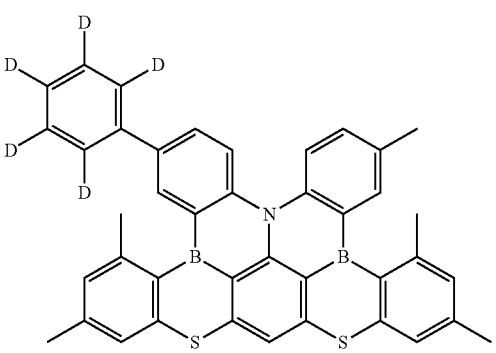

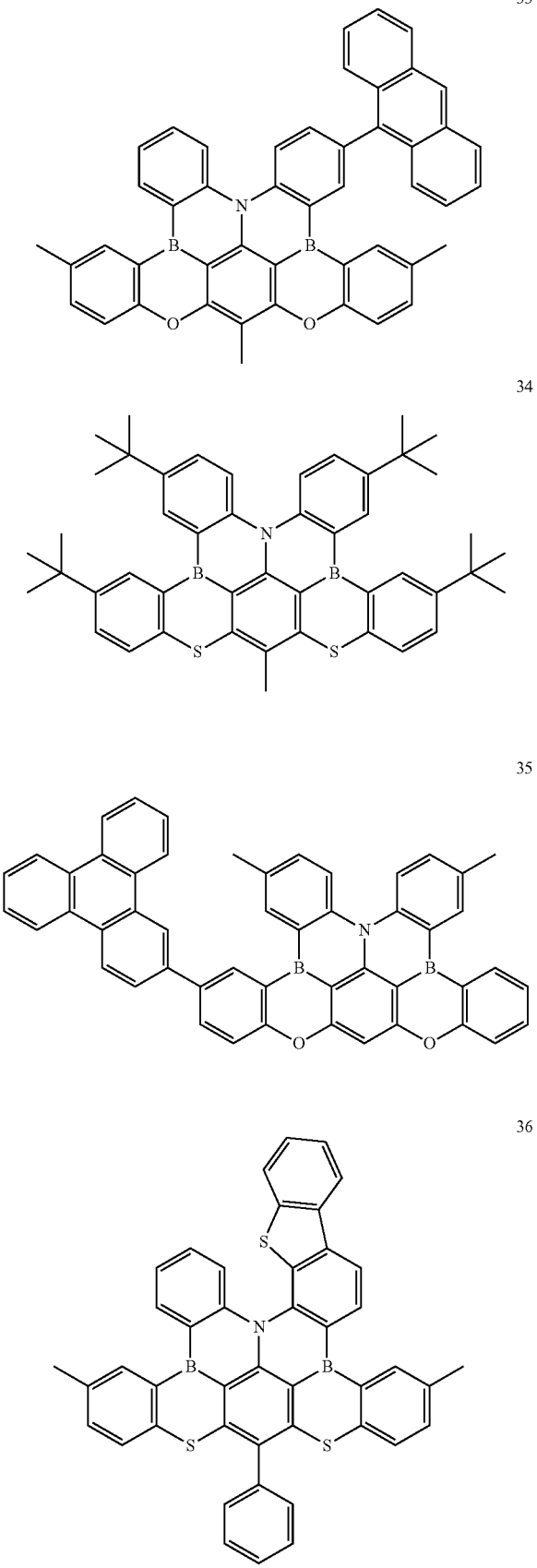
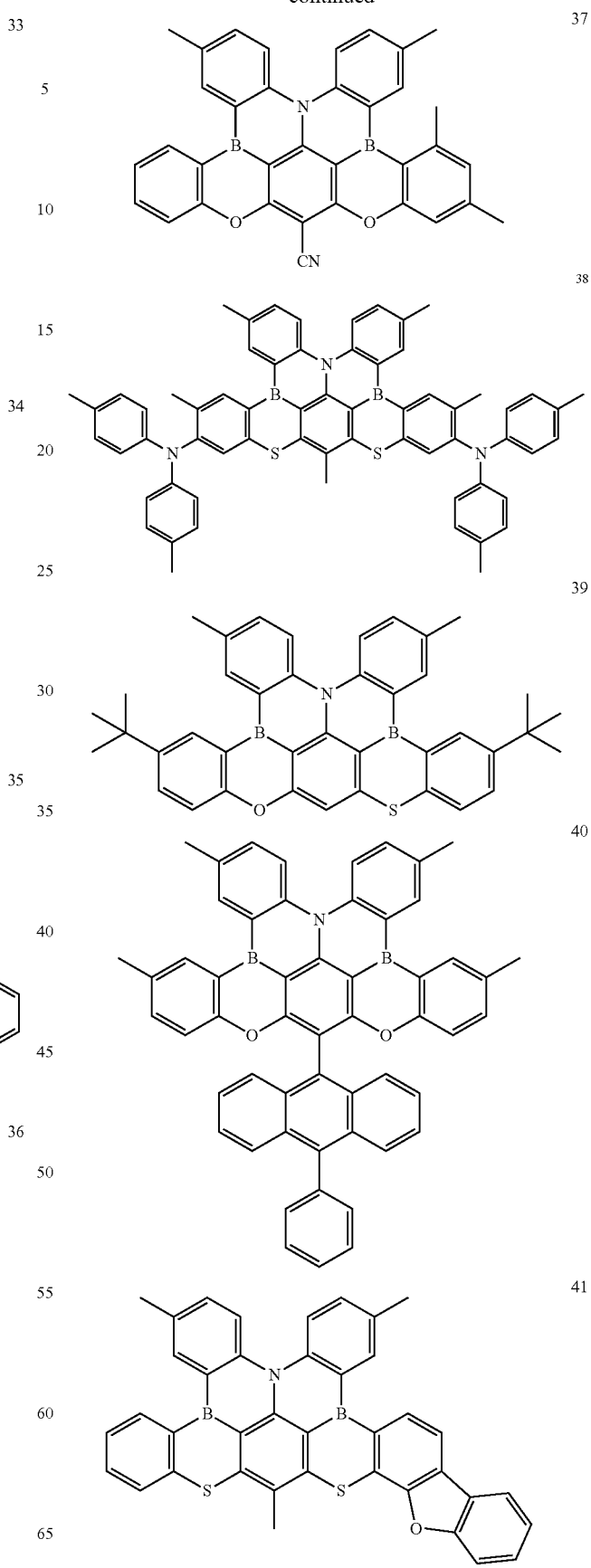

-continued

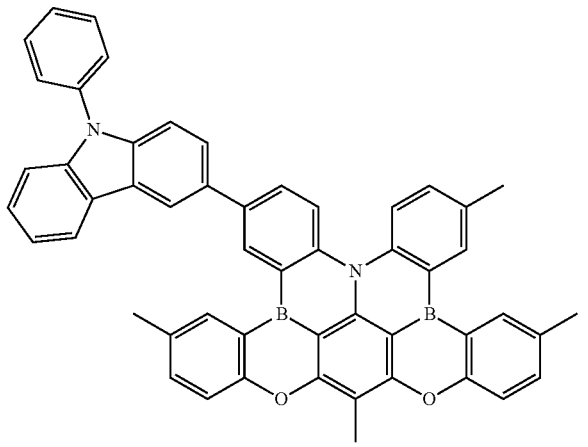
42

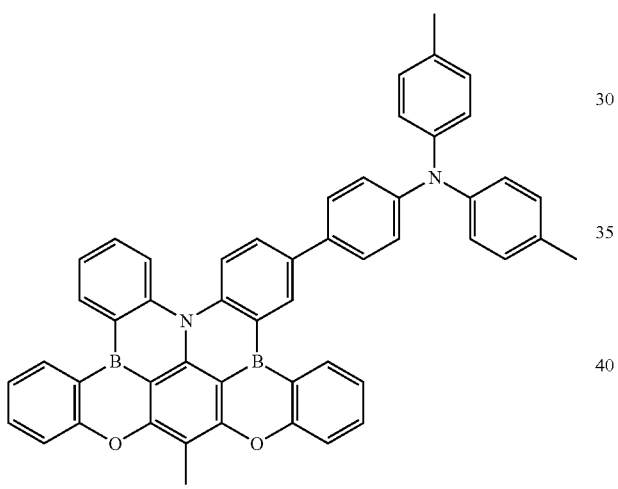
43

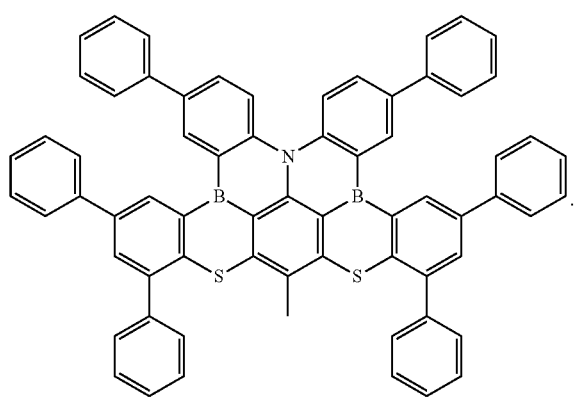
44

14. A polycyclic compound represented by the following Formula 1:

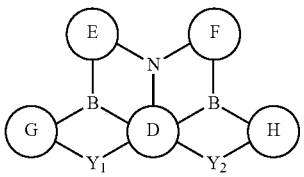
Formula 1 in Formula 1, ring D to ring H are each independently a substituted or unsubstituted aryl group having 6 to 30 carbon atoms for forming a ring, or a substituted or unsubstituted heteroaryl group having 2 to 30 carbon atoms for forming a ring, and $Y_1$ and $Y_2$ are each independently O or S.

15. The polycyclic compound of claim 14, wherein the polycyclic compound is represented by the following Formula 2:

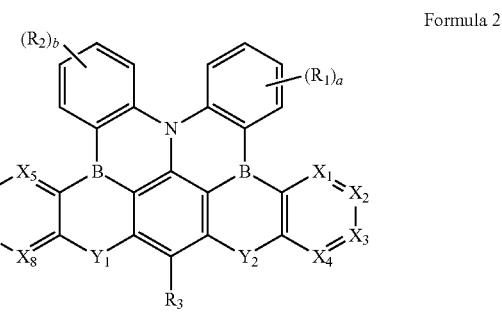
Formula 2 in Formula 2, $X_1$ to $X_8$ are each independently N or $CR_4$, $R_1$ to $R_3$ and $R_4$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or combined with an adjacent group to form a ring, a and b are each independently an integer of 0 to 4, and $Y_1$ and $Y_2$ are the same as defined in Formula 1.

16. The polycyclic compound of claim 15, wherein the polycyclic compound is represented by the following Formula 3:

Formula 3

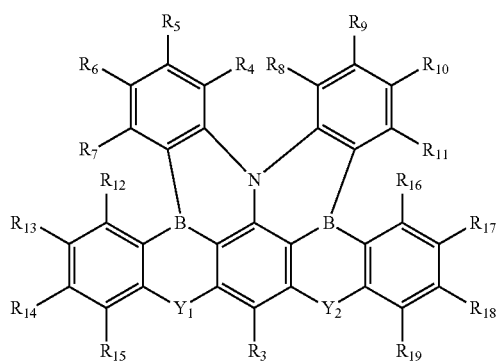

in Formula 3, $R_4$ to $R_{19}$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or combined with an adjacent group to form a ring, and $Y_1$, $Y_2$, and $R_3$ are the same as defined in Formula 2.

17. The polycyclic compound of claim 16, wherein groups in at least one pair among $R_4$ and $R_5$, $R_5$ and $R_6$, $R_6$ and $R_7$, $R_8$ and $R_9$, $R_9$ and $R_{10}$, $R_{10}$ and $R_{11}$, $R_{12}$ and $R_{13}$, $R_{13}$ and $R_{14}$, $R_{14}$ and $R_{15}$, $R_{16}$ and $R_{17}$, $R_{17}$ and $R_{18}$, and $R_{18}$ and $R_{19}$ are combined with each other to form a ring represented by any one among the following Formula 4-1 to Formula 4-4:

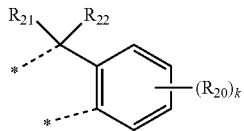
Formula 4-1

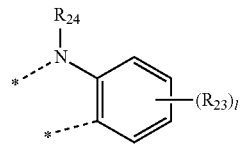
Formula 4-2

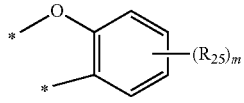
Formula 4-3

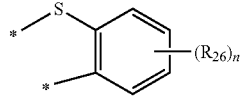
Formula 4-4 in Formula 4-1 to Formula 4-4, $R_{20}$ to $R_{26}$ are each independently a hydrogen atom, a deuterium atom, a halogen atom, a nitrile group, a substituted or unsubstituted amine group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, and k to n are each independently an integer of 0 to 4.

18. The polycyclic compound of claim 16, wherein at least one pair among $R_4$ and $R_8$, $R_7$ and $R_{12}$, and $R_{11}$ and $R_{16}$ is combined with —O— or —S— to form a ring.

19. The polycyclic compound of claim 16, wherein the polycyclic compound is represented by any one among the following Formula 5-1 to Formula 5-3:

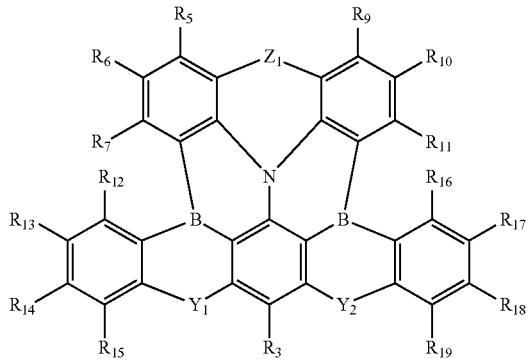
Formula 5-1

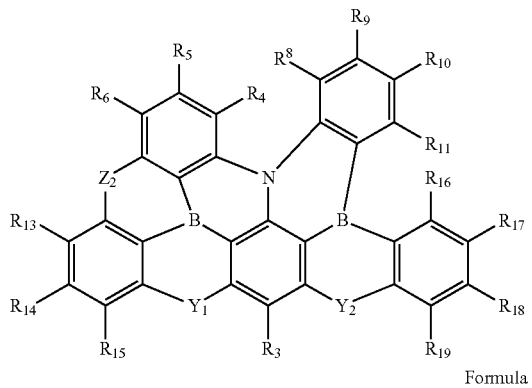
Formula 5-2

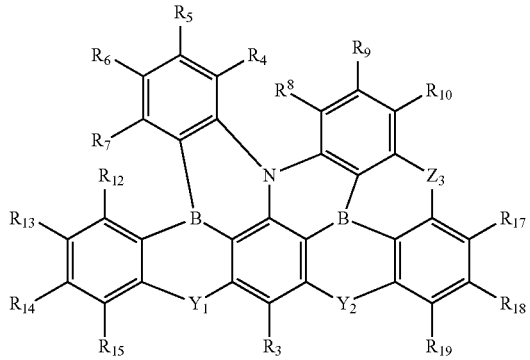
Formula 5-3 in Formula 5-1 to Formula 5-3, $Z_1$ to $Z_3$ are each independently O or S, and $R_3$ to $R_{19}$, $Y_1$ and $Y_2$ are the same as defined in Formula 3.

20. The polycyclic compound of claim 14, wherein the polycyclic compound is any one among compounds represented in the following Compound Group 1:

Compound Group 1
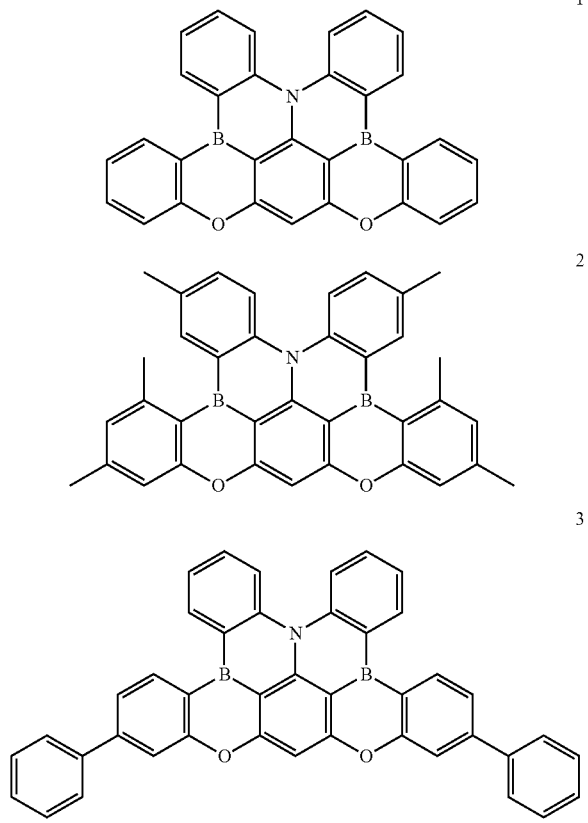
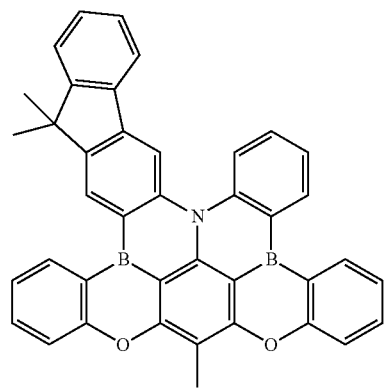
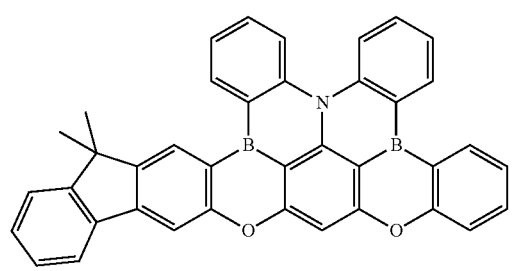
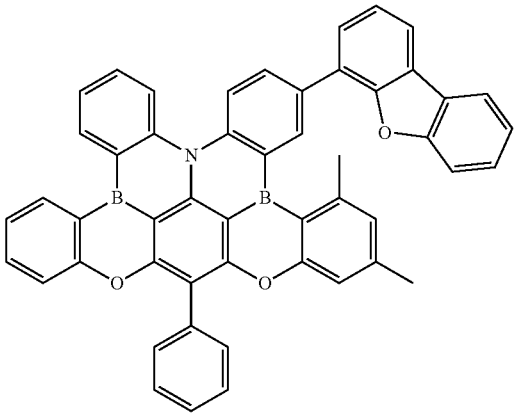
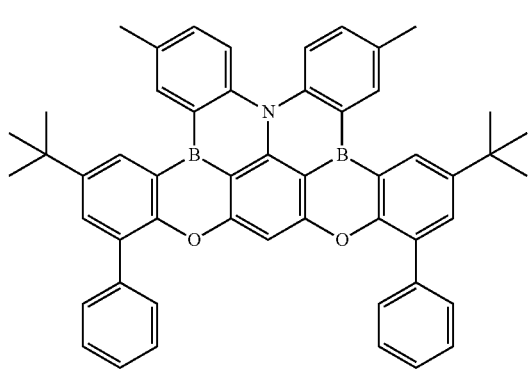
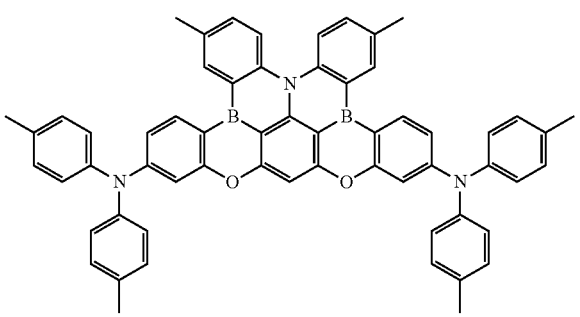

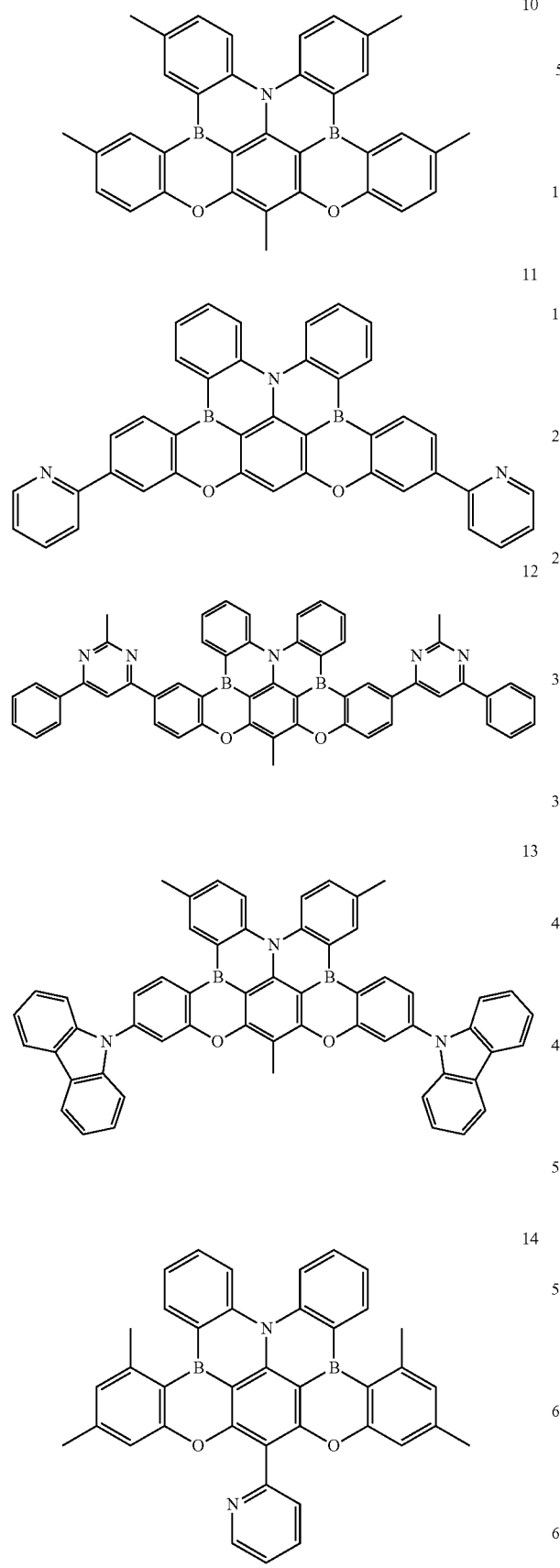
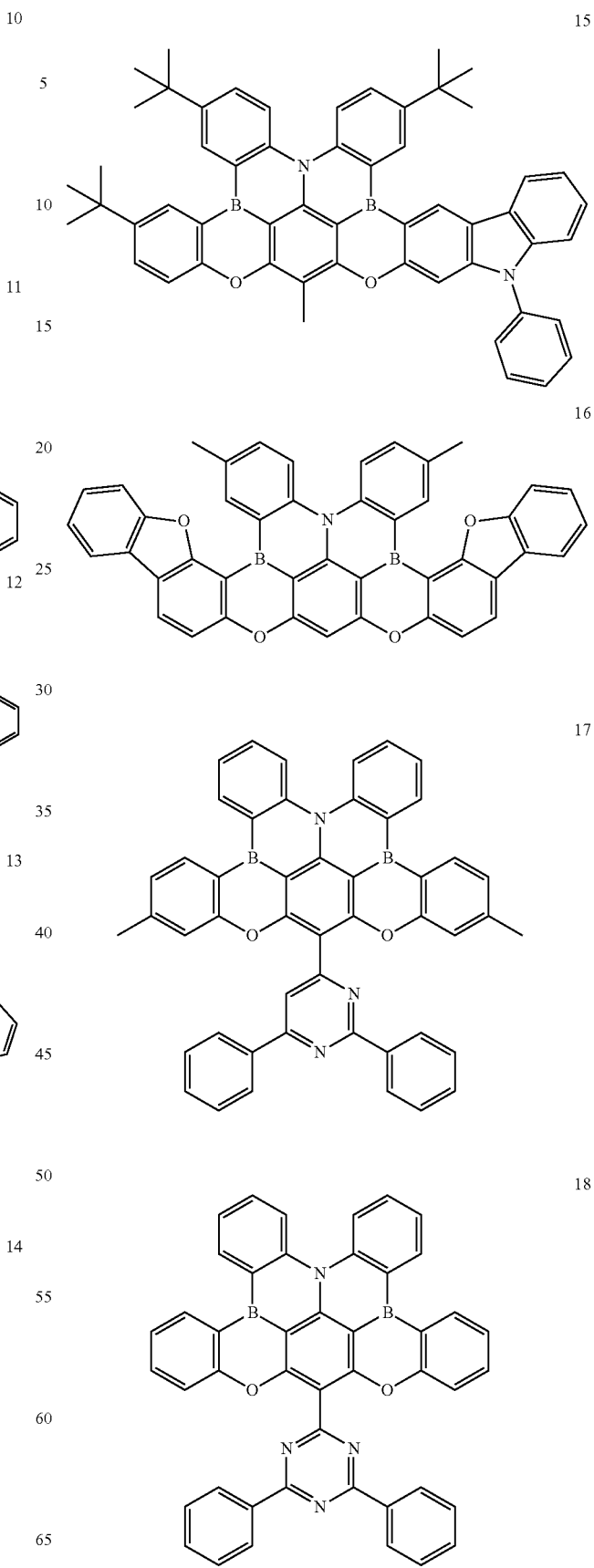

19
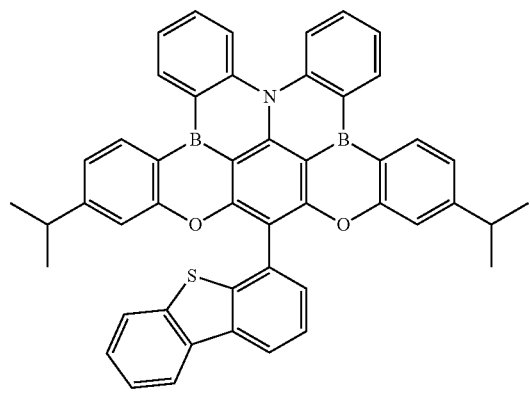
20
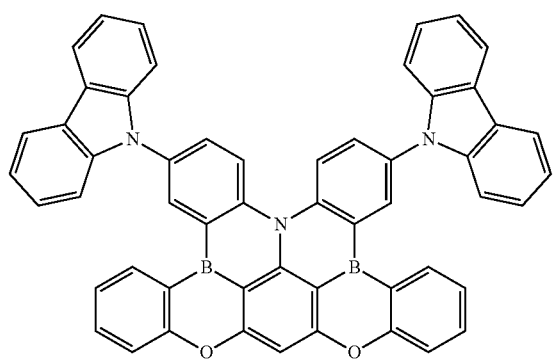
21
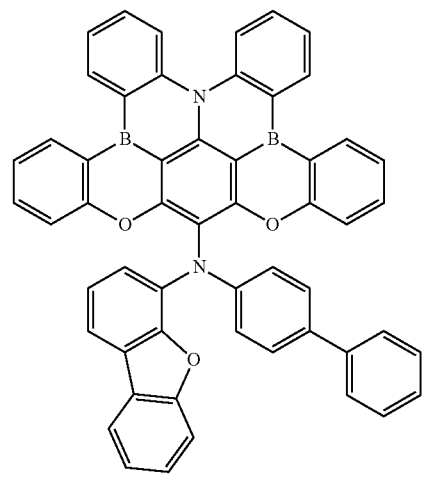
22
23
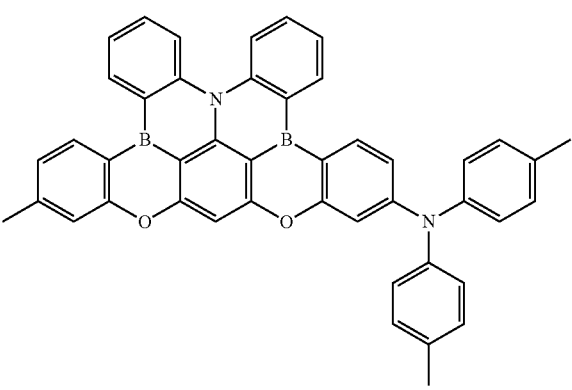
24
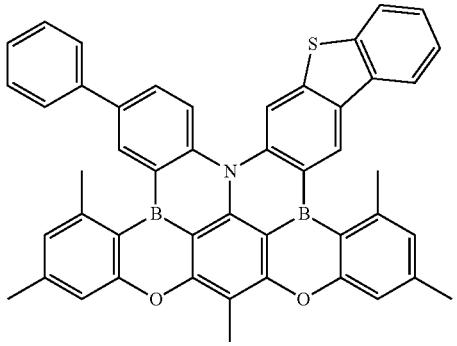
25
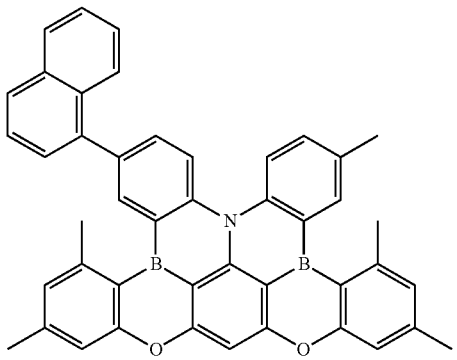
26
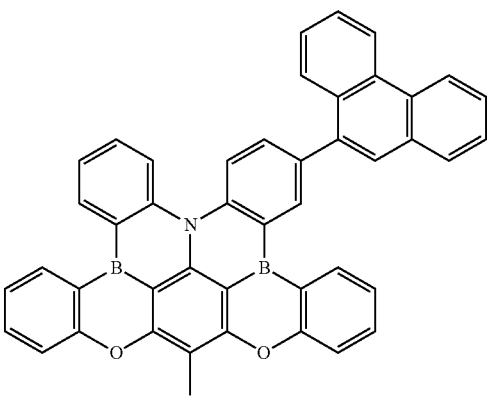

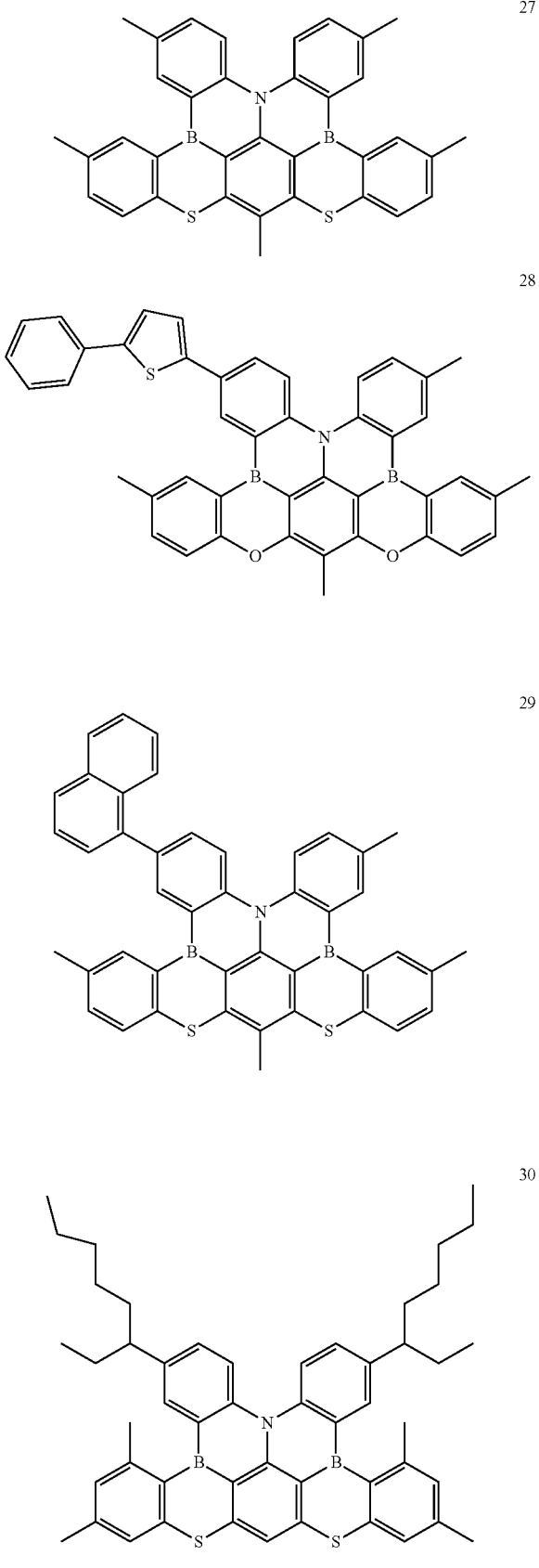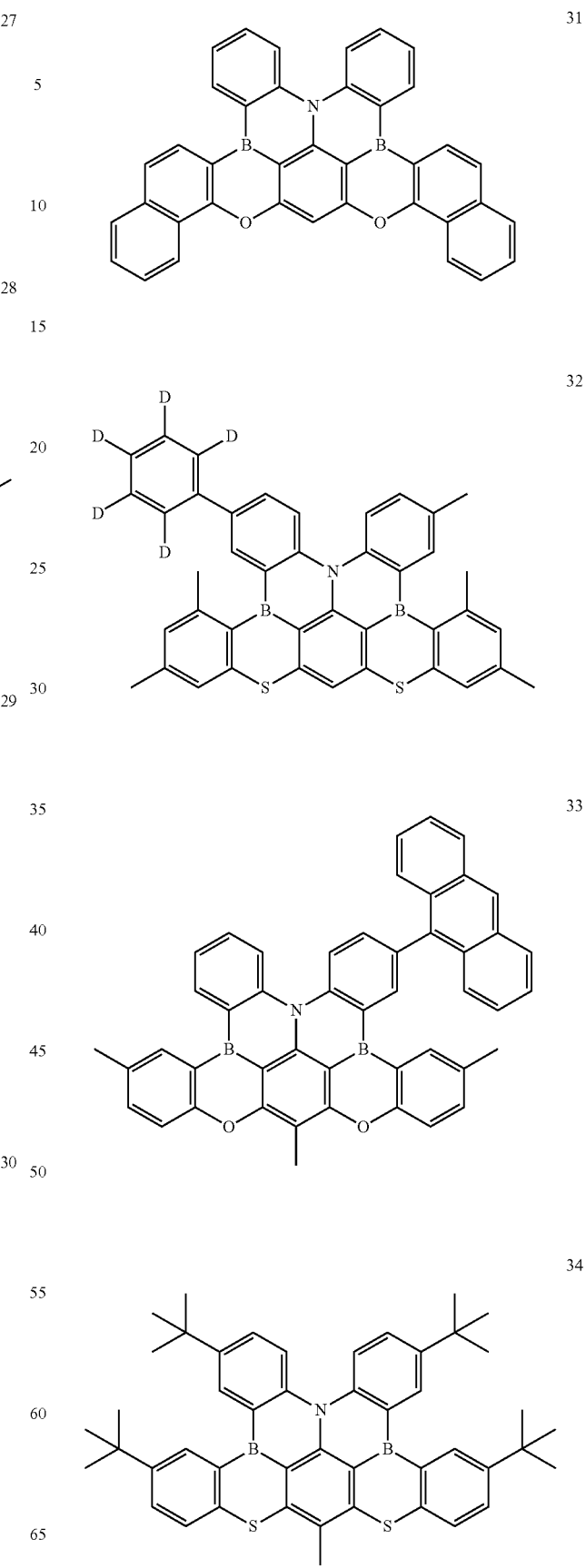

35
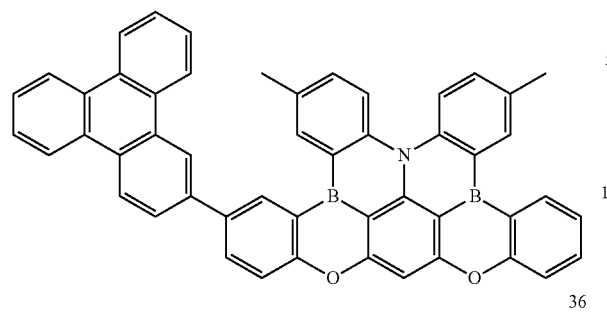
36
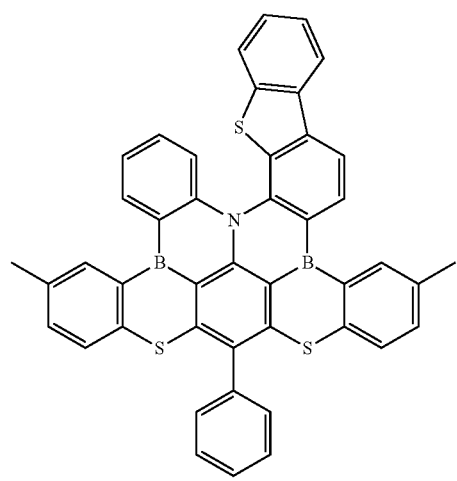
37
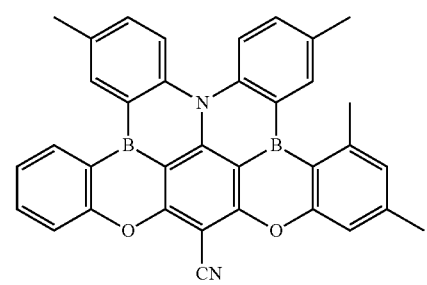
38
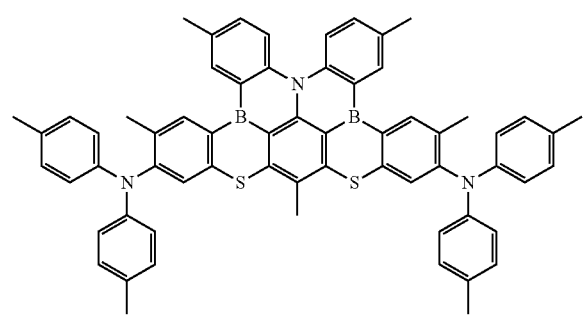
39
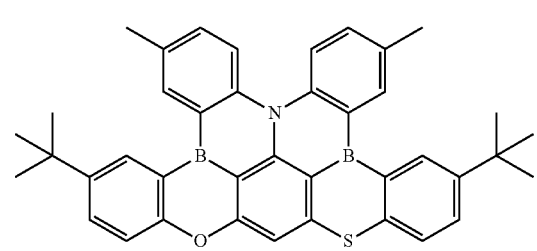
40
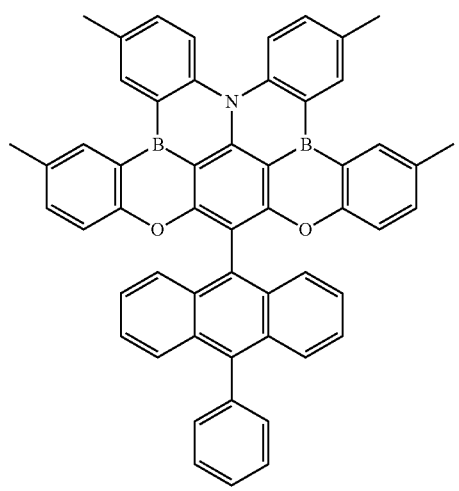
41
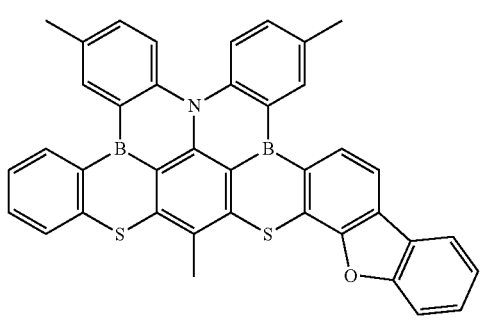
42
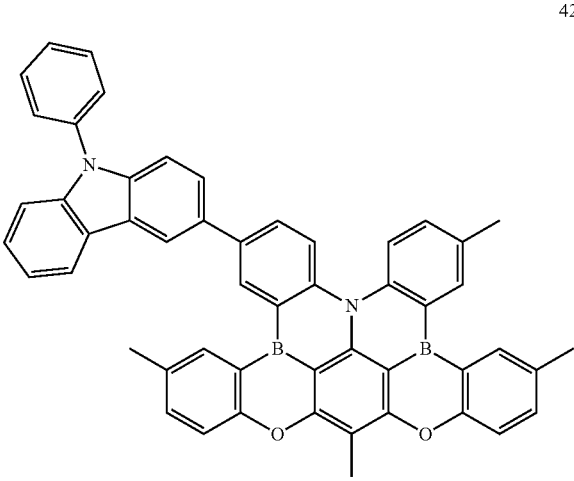

43
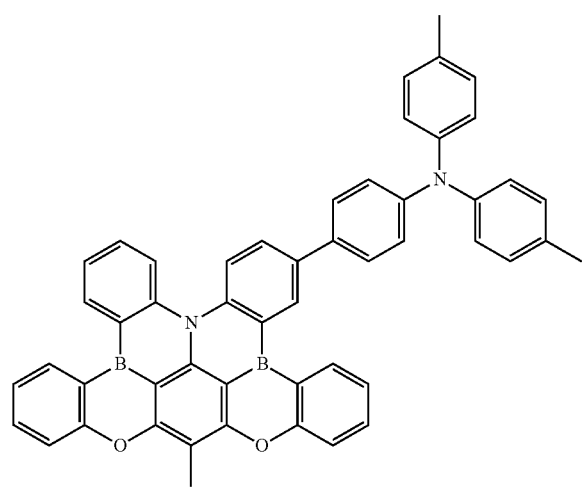
44
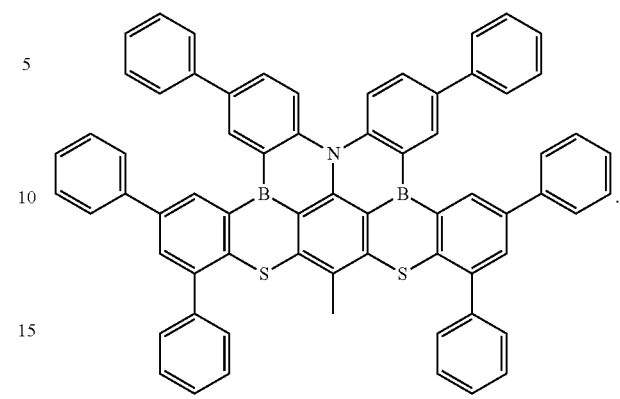
* * * * *